(12) United States Patent
Nishikawa et al.

(10) Patent No.: US 6,491,435 B1
(45) Date of Patent: Dec. 10, 2002

(54) LINEAR ROBOT

(75) Inventors: Katsuhito Nishikawa; Thomas F. Carlos, both of San Jose, CA (US)

(73) Assignee: Moore Epitaxial, Inc., Tracy, CA (US)

( * ) Notice: Subject to any disclaimer, the term of this patent is extended or adjusted under 35 U.S.C. 154(b) by 0 days.

(21) Appl. No.: 09/624,749

(22) Filed: Jul. 24, 2000

(51) Int. Cl.[7] .............................................. F16C 32/06
(52) U.S. Cl. .......................... 384/12; 384/7; 414/935; 414/676
(58) Field of Search .............................. 384/12, 13, 15, 384/16, 100, 107, 114, 115, 118, 112, 121, 123; 414/935, 941, 676

(56) References Cited

U.S. PATENT DOCUMENTS

| | | | |
|---|---|---|---|
| 3,466,951 A | * 9/1969 | Greenberg | 384/12 |
| 4,191,385 A | 3/1980 | Fox et al. | |
| 4,425,508 A | 1/1984 | Lewis, Jr. et al. | |
| 4,558,909 A | 12/1985 | Stauber | |
| 4,606,587 A | * 8/1986 | Thompson | 384/12 |
| 4,726,689 A | 2/1988 | Pollock | |
| 4,749,283 A | 6/1988 | Yokomatsu et al. | |
| 4,822,182 A | 4/1989 | Matsushita et al. | |
| 4,969,169 A | 11/1990 | Forsyth et al. | |
| 4,978,233 A | * 12/1990 | Stotzel et al. | 384/12 |
| 5,133,561 A | 7/1992 | Hattori et al. | |
| 5,218,896 A | 6/1993 | Furukawa | |
| 5,562,396 A | * 10/1996 | Yamazaki et al. | 384/12 |
| 5,746,460 A | 5/1998 | Marohl et al. | |
| 5,784,925 A | 7/1998 | Trost et al. | |
| 5,810,549 A | 9/1998 | Wytman | |
| 5,872,632 A | 2/1999 | Moore | |
| 6,163,033 A | 12/2000 | Smick et al. | |

FOREIGN PATENT DOCUMENTS

DE    2754395    * 6/1979    .................. 384/12

OTHER PUBLICATIONS

Innovation Robotics, IRSI 800 Wafer Handling Robot System, May 2000, 2 pages.

\* cited by examiner

Primary Examiner—William C Joyce
(74) Attorney, Agent, or Firm—Gunnison, McKay & Hodgson, L.L.P.; Serge J. Hodgson

(57) ABSTRACT

A linear robot includes a slide and an end effector arm connected to the slide. The end effector arm includes an end effector. During use, vacuum is selectively supplied to the end effector, with selectively grabs and releases substrates. The slide is supported on a hanger. An air bearing between the slide and the hanger allows the slide and end effector arm including any substrates held by the end effector to freely move along the hanger. The entire periphery of an air bearing surface of the slide is lined by a collector, which is coupled to a vacuum source. Pressurized gas from the air bearing region between the slide and the hanger is captured by the collector. Thus, any particulates entrained with the pressurized gas are captured and do not contaminate the substrates.

26 Claims, 12 Drawing Sheets

LINEAR ROBOT

This application is related to Nishikawa et al., co-filed and commonly assigned U.S. patent application Ser. No. 09/624,425 entitled "PARTICULATE FREE AIR BEARING AND SEAL", which is herein incorporated by reference in its entirety.

BACKGROUND OF THE INVENTION

1. Field of the Invention

This invention relates generally to semiconductor process equipment, and more particularly, to a linear robot and method of using the same.

2. Description of the Related Art

Semiconductor processing typically involved the formation of one or more layers on a semiconductor substrate. As those of skill in the art understand, it was, critical to avoid particulate contamination of the formed layers.

Disadvantageously, mechanical bearings employed with the semiconductor processing equipment were a primary source of particulate generation and contamination. For example, when the mechanical bearing was a ball bearing, friction on the balls of the bearing generated particulates.

For this reason, air bearings were frequently employed. An air bearing used a layer of gas between moving parts thus avoiding particulate generation from friction between the parts. Although reducing particulate generation compared to a mechanical bearing, as discussed in greater detail below with reference FIGS. 1 and 2, an air bearing was still a significant source of particulate generation and contamination.

FIG. 1 is a perspective view of an air bearing 10 in accordance with the prior art. FIG. 2 is a cross-sectional view of air bearing 10 of FIG. 1 along the line II—II. Referring now to FIGS. 1 and 2 together, air bearing 10 included a rectangular slide 12 and an air bearing body 14. Pressurized gas, e.g., air or nitrogen, indicated as arrow 16, was supplied to air bearing body 14 through a pressurized gas port 18. This pressurized gas passed through a channel in air bearing body 14 and was supplied at the interface of slide 12 and air bearing body 14, hereinafter called an air bearing region 20.

Due to this pressurized gas, slide 12 floated on air bearing body 14. Stated another way, a layer of gas, sometimes called an air bearing, was located between slide 12 and air bearing body 14. Accordingly, slide 12 moved on a layer of gas thus avoiding particulate generation due to friction between slide 12 and air bearing body 14.

To maintain the air bearing, pressurized gas was continuously supplied to air bearing region 20. This pressurized gas continuously escaped from air bearing region 20 into a clean area 30 as indicated by arrows 22. Clean area 30 was an area in which particulates were undesirable, e.g., an area in which silicon wafers or other substrates were handled.

Although great care was taken to supply only the highest purity pressurized gas, the pressurized gas inherently contained particulates. As the pressurized gas escaped from air bearing region 20 into clean area 30, the particulates contained within the pressurized gas also escaped from air bearing region 20 into clean area 30. These particulates were a significant source of particulate contamination of clean area 30.

Further, as the pressurized gas escaped from air bearing region 20, the pressurized gas had a tendency to dislodge and move about particulates within the vicinity of air bearing 10 in clean area 30. This also was a significant source of particulate contamination of clean area 30.

SUMMARY OF THE INVENTION

In accordance with the present invention, a particulate free air bearing and seal is formed between a slide and an air bearing body. Pressurized gas is supplied to an air bearing region between a first air bearing surface of the slide and a second air bearing surface of the air bearing body. The pressurized gas is supplied to the air bearing region through a distributor in the second air bearing surface of the air bearing body. The pressurized gas causes the slide to float on the air bearing body avoiding particulate generation due to friction between the slide and the air bearing body.

As pressurized gas is supplied to the air bearing region, vacuum is simultaneously supplied to a collector also in the second air bearing surface of the air bearing body. The collector captures the pressurized gas escaping from the air bearing region and prevents the pressurized gas from entering a clean area.

Since the pressurized gas from the air bearing region is prevented from entering the clean area, any possibility of particulate contamination of the clean area from particulates entrained within the pressurized gas is eliminated.

This is in contrast to a prior art air bearing where the pressurized gas, which escaped from the air bearing region, entrained particulates into the clean area within the vicinity of the air bearing. These particulates were a significant source of particulate contamination in the prior art.

Further, since the pressurized gas escaping from the air bearing region is prevented from entering the clean area, any possibility of the pressurized gas dislodging and moving about particulates within the clean area is eliminated. This is in contrast to a prior art air bearing where the pressurized gas, which escaped from the air bearing region into the clean area, had a tendency to dislodge and move about particulates in the clean area. These particulates were also a significant source of particulate contamination in the prior art.

In an alternative embodiment, the slide and the air bearing body are stationary and do not move with respect to one another or, alternatively, move on mechanical bearings between the slide and the air bearing body. In accordance with this embodiment, the air bearing functions as a seal instead of as an air bearing. The air bearing prevents particulates from passing between the air bearing body and the slide.

Since the air bearing region is supplied with pressurized gas from the distributor, the air bearing region is at a higher pressure than areas adjacent the air bearing region (the adjacent areas), e.g., the air bearing is between the clean area and a dirty area in which motors are located. Thus, any leakage of gas is pressurized gas leakage from the air bearing region into the adjacent areas and not vice versa. This prevents gas and particulates in the adjacent areas from entering into the air bearing region.

Further, even if gas and particulates do enter the air bearing region, the gas and particulates are captured by the collector and prevented from escaping from the air bearing region. In the above manner, the air bearing forms a seal between the air bearing body and the slide.

In one embodiment, the air bearing body is a tabletop, which remains stationary. The slide is a robot pedestal, which rotates and moves upwards and downwards during substrate handling. An air bearing between the tabletop and the robot pedestal forms a seal which prevents particulates from escaping between the tabletop and the robot pedestal as the robot pedestal moves.

In another embodiment, a robot arm-includes a slide and an end effector arm mounted to the slide. The slide is supported on a hanger. An air bearing between the slide and the hanger allows the slide to freely move on the hanger along a linear axis of the robot arm. Advantageously, the slide moves on the hanger without generating any particulates.

The slide has a base, which has a first surface. A vacuum coupler trench and a pressurized gas coupler trench are in the first surface of the base. The hanger has a vacuum channel and a pressurized gas channel. The vacuum channel extends to a first aperture in a lower surface of the hanger. The first aperture is aligned with the vacuum coupler trench.

The pressurized gas channel extends to a second aperture in the lower surface of the hanger. The second aperture is aligned with the pressurized gas coupler trench.

The pressurized gas coupler trench is coupled to a distributor in an air bearing surface of the slide. During use, pressurized gas is supplied through the pressurized gas channel in the hanger to the pressurized gas coupler trench of the slide. The pressurized gas is supplied from the pressurized gas coupler trench to the distributor, thus forming the air bearing between the slide and the hanger.

Of importance, the entire periphery of the air bearing surface of the slide is lined with a collector. The collector is coupled to the vacuum coupler trench. Vacuum is supplied through the vacuum channel in the hanger to the vacuum coupler trench of the slide. The vacuum is supplied from the vacuum coupler trench to the collector.

Advantageously, pressurized gas from the distributor is captured by the collector. Thus, any particulates entrained within the pressurized gas do not escape into the vicinity of the slide, e.g., into a clean area in which substrates are handled.

These and other features and advantages of the present invention will be more readily apparent from the detailed description set forth below taken in conjunction with the accompanying drawings.

BRIEF DESCRIPTION OF THE DRAWINGS

In the following description; the same or similar elements are labeled with the same or similar reference numbers.

DETAILED DESCRIPTION

Figure 1:
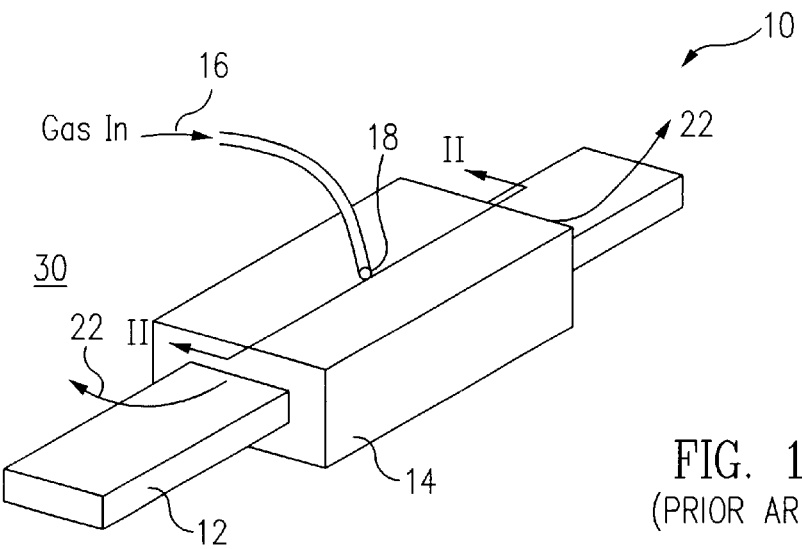
FIG. 1 is a perspective view of an air bearing in accordance with the prior art.
Figure 2:
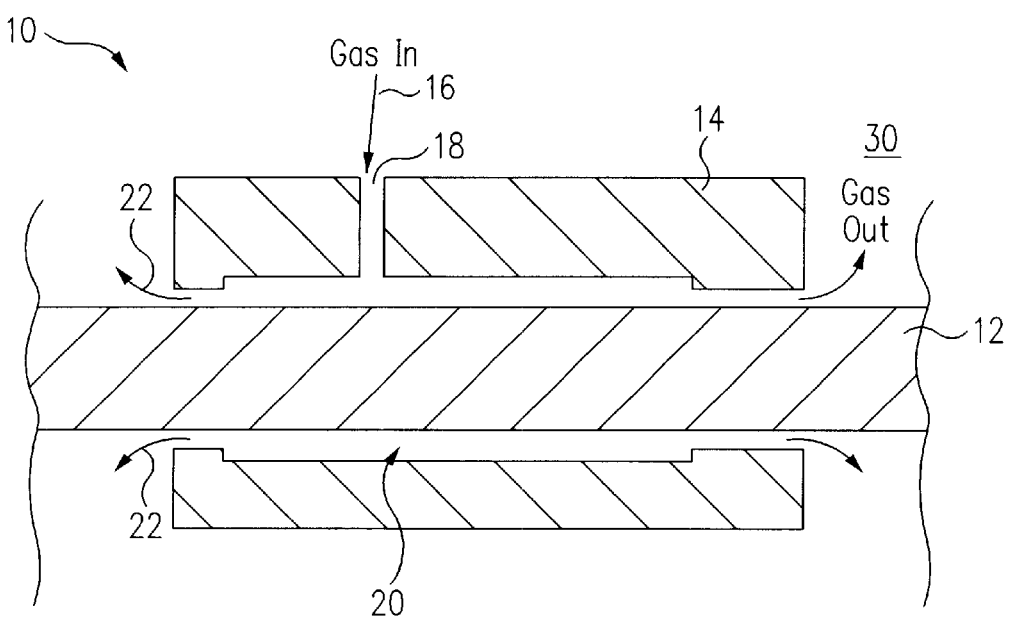
FIG. 2 is a cross-sectional view of the air bearing of FIG. 1 along the line II—II.

In accordance with the present invention, a particulate free air bearing 300 (FIG. 3) is formed between a slide 304 and an air bearing body 302. Pressurized gas is supplied to an air bearing region 326 between a first air bearing surface 306 of slide 304 and a second air bearing surface 316 of air bearing body 302. The pressurized gas is supplied to air bearing region 326 through a distributor 318 as indicated by arrows 328. This pressurized gas causes slide 304 to float on air bearing body 302 avoiding particulate generation due to friction between slide 304 and air bearing body 302.

As pressurized gas is supplied to air bearing region 326, vacuum is simultaneously supplied to a collector 324. Collector 324 captures the pressurized gas escaping from air bearing region 326 and prevents the pressurized gas from entering a clean area 340. This eliminates any possibility of particulate contamination of clean area 340 from particulates entrained within the pressurized gas.

This is in contrast to a prior art air bearing where the pressurized gas, which escaped from the air bearing region, entrained particulates into the clean area. These particulates were a significant source of particulate contamination in the prior art.

Further, since the pressurized gas escaping from air bearing region 326 is prevented from entering clean area 340, any possibility of the pressurized gas dislodging and moving about particulates within clean area 340 is eliminated. This is in contrast to a prior art air bearing where the pressurized gas, which escaped from the air bearing region into the clean area, had a tendency to dislodge and move about particulates in the clean area. These particulates were also a significant source of particulate contamination in the prior art.

In an alternative embodiment, slide 304 and air bearing body 302 move on mechanical bearings between slide 304 and air bearing body 302. In accordance with this embodiment, air bearing 300 functions as a seal instead of as an air bearing. Air bearing 300 prevents particulates from passing between air bearing body 302 and slide 304.

Since air bearing region 326 is between clean area 340 and a dirty area 342 and is supplied with pressurized gas from distributor 318, air bearing region 326 is at a higher pressure than clean area 340 or dirty area 342. Thus, any leakage of gas is pressurized gas leakage from air bearing region 326 into clean area 340 or dirty area 342 and not vice versa. This prevents gas and particulates in dirty area 342 from entering into air bearing region 326.

Further, even if gas and particulates do enter air bearing region 326, the gas and particulates are captured by collector 324 and prevented from escaping into clean area 340. In the above manner, air bearing 300 forms a seal between air bearing body 302 and slide 304, which prevents particulates and gas from dirty area 342, e.g., a first area, from contaminating clean area 340, e.g., a second area.

In another embodiment (FIG. 8), a robot arm 410 includes a slide 710 and an end effector arm 712 mounted to slide 710. Slide 710 is supported on a hanger 720. An air bearing 300B between slide 710 and hanger 720 allows slide 710 to freely move on hanger 720. Advantageously, slide 710 moves on hanger 720 without generating any particulates.

Figure 12:
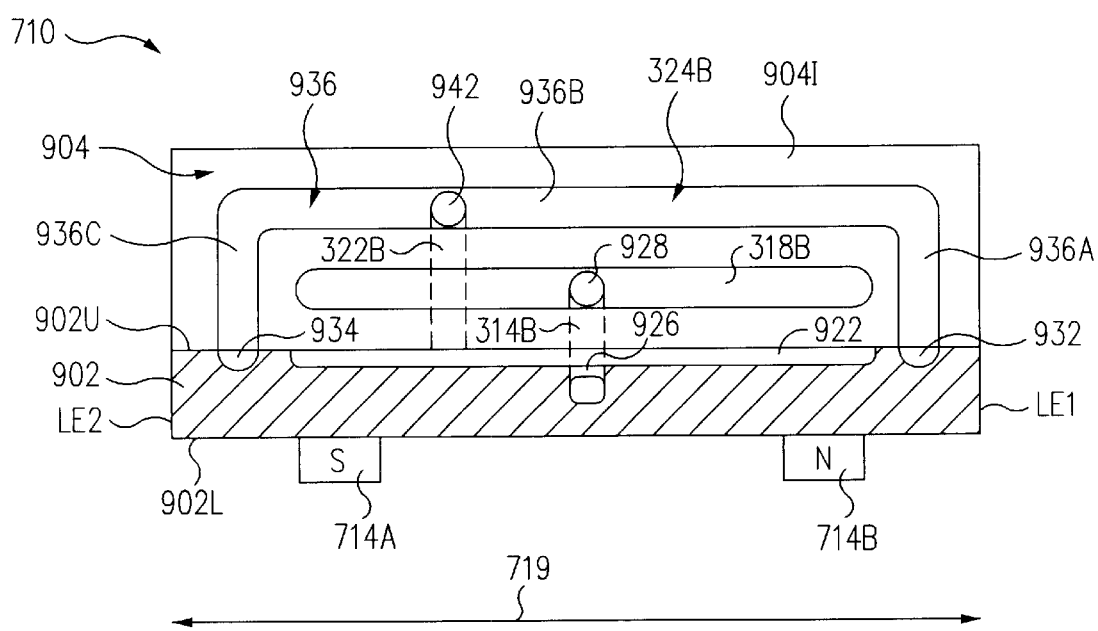
FIG. 12 is a cross-sectional view of the slide along the line XII—XII of FIG. 9.
Figure 10:
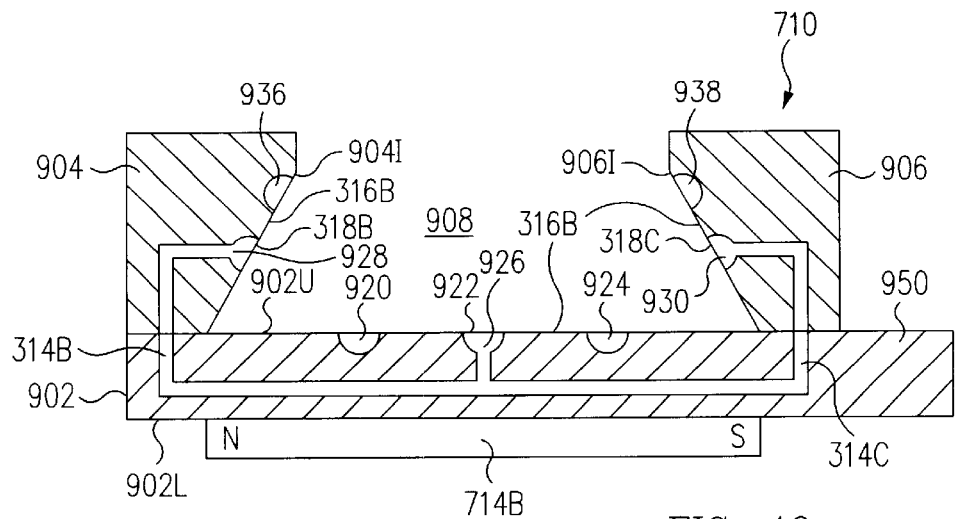
FIG. 10 is a cross-sectional view of the slide along the line X—X of FIG. 9.
Figure 11:
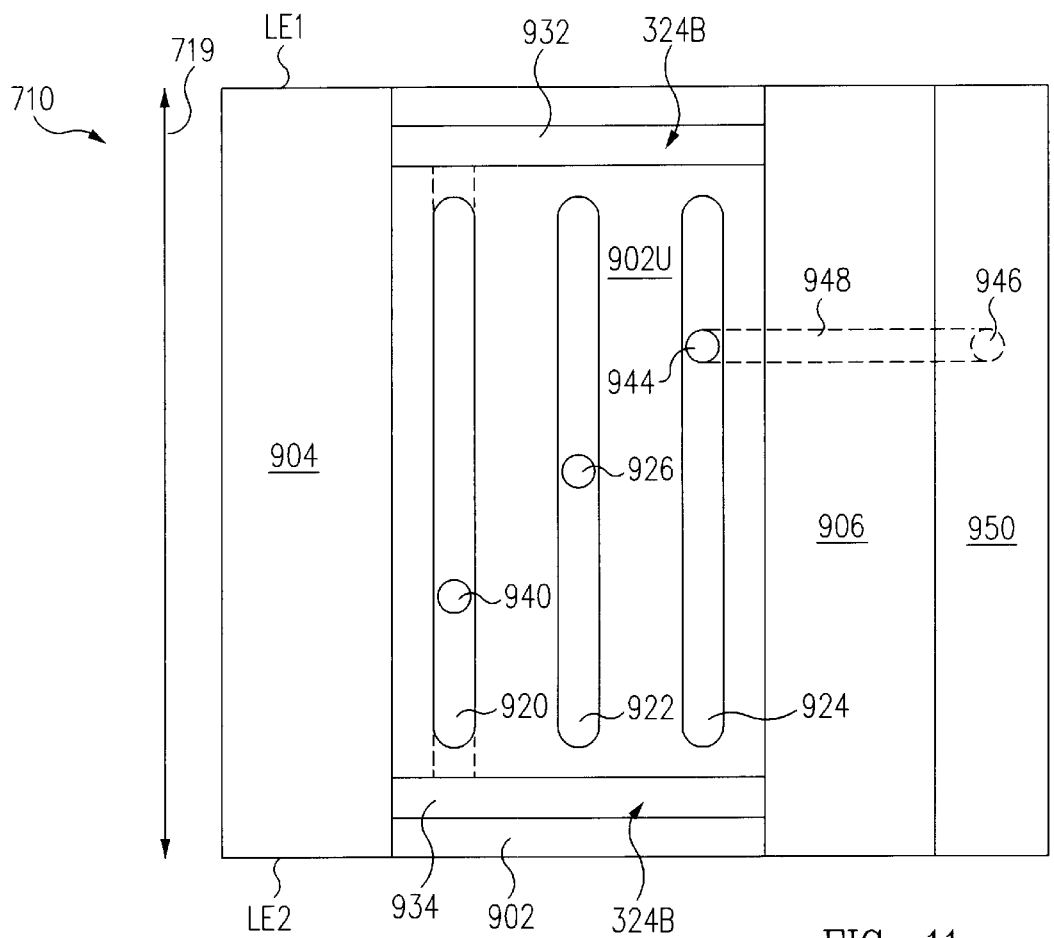
FIG. 11 is a top plan view of the slide of FIG. 9.

Referring to FIGS. 10, 11 and 12, upper surface 902U, interior surface 904I and interior surface 906I collectively form an air bearing surface 316B of slide 710. Of importance, the entire periphery of air bearing surface 316B is lined with a collector 324B. During use, vacuum is supplied to collector 324B.

Advantageously, collector 324B prevents any pressurized gas from escaping from air bearing 300B. Thus, any particulates entrained within the pressurized gas do not escape into the vicinity of slide 710.

Figure 3:
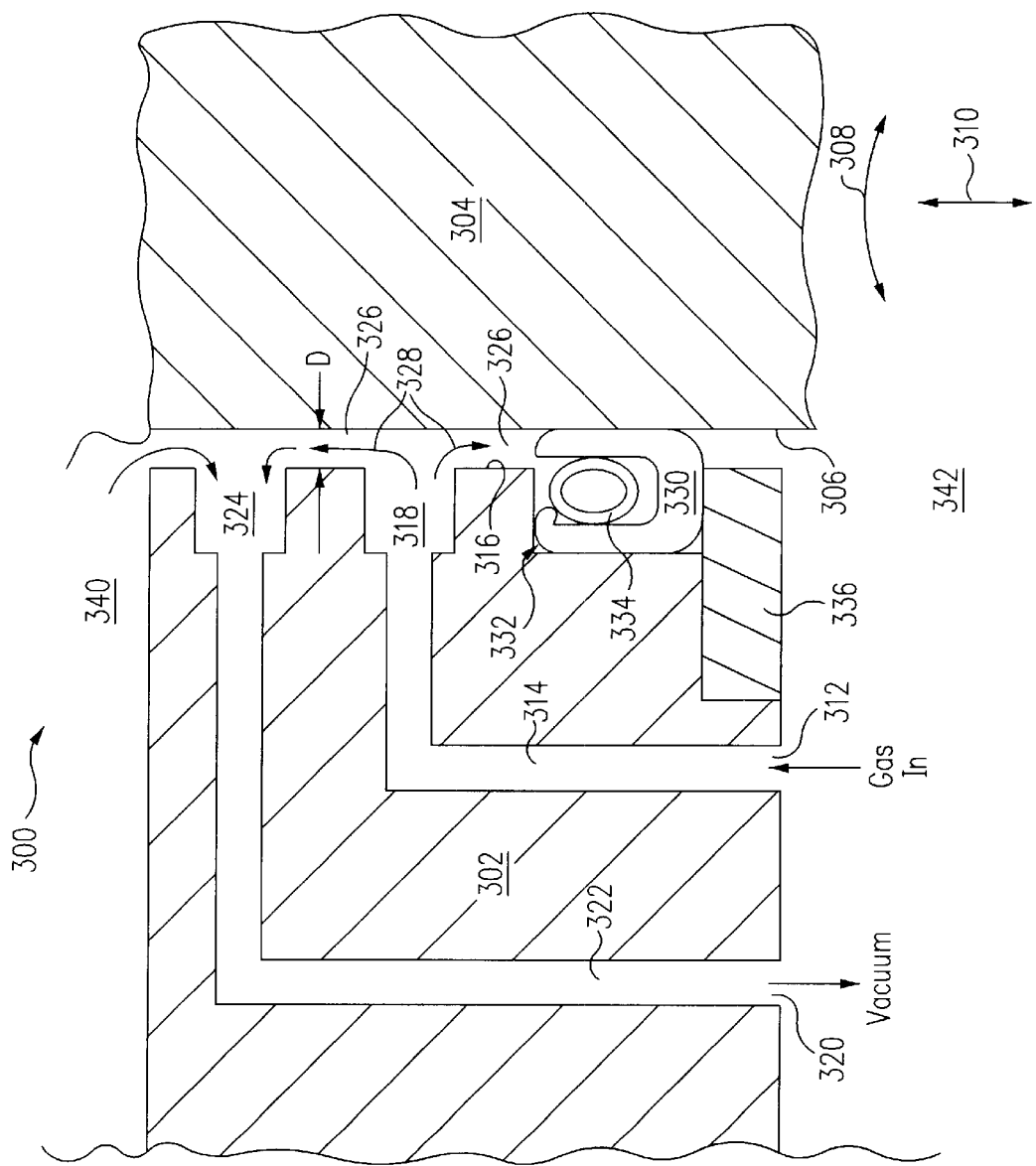
FIG. 3 is a cross-sectional view of an air bearing in accordance with one embodiment of the present invention.

More particularly, FIG. 3 is a cross-sectional view of an air bearing 300 in accordance with one embodiment of the present invention. Air bearing 300 includes an air bearing body 302 and a slide 304.

In this embodiment, slide 304 is a cylindrical slide having a smooth air bearing surface 306, sometimes called a first air bearing surface or first surface. Generally, slide 304 is capable of moving relative to air bearing body 302. For example, slide 304 rotates around its longitudinal axis as indicated by arrow 308. Further, slide 304 moves up and down along its longitudinal axis as indicated by arrow 310.

Air bearing body 302 has a pressurized gas inlet port 312 coupled to a source of pressurized gas, e.g., pressurized air or nitrogen. A channel 314 extending through air bearing body 302 is coupled to pressurized gas inlet port 312. Channel 314 extends to a smooth air bearing surface 316 of air bearing body 302, sometimes called a second air bearing surface or second surface.

Illustratively, (1) the smoothness of air bearing surfaces 306, 316 is 16 microinches (0.0004 mm) root mean square (RMS) or less, e.g., 4 microinches (0.0001 mm) to 8 microinches (0.0002 mm) RMS; (2) a distance D between air bearing surface 306 and air bearing surface 316 is within the approximate range of 0.001 in. (0.025 mm) to 0.0015 in. (0.038 mm); and the pressure of pressurized gas supplied to pressurized gas inlet port 312 is within the approximate range of 80 pounds per square inch (PSI) to 90 PSI, although other values are used in other embodiments.

To enhance air distribution at air bearing surface 316, channel 314 is coupled to a distributor 318, e.g., a trench or aperture, in air bearing surface 316. Thus, distributor 318 is coupled to pressurized gas inlet port 312.

Air bearing body 302 further has a vacuum port 320 coupled to a source of vacuum. A channel 322 extending through air bearing body 302 is coupled to vacuum port 320. Channel 322 extends to air bearing surface 316 of air bearing body 302. To enhance air collection at air bearing surface 316, channel 322 is coupled to a collector 324, e.g., a trench or aperture, in air bearing surface 316. Thus, collector 324 is coupled to vacuum port 320.

Mounted to air bearing body 302 is a seal 330. Seal 330 is located within a seal cavity 332 in air bearing surface 316. Located within seal 330 is a seal spring 334. Generally, seal 330 extends from air bearing surface 316 of air bearing body 302 to air bearing surface 306 of slide 304. As those of skill in the art will understand, seal spring 334 presses seal 330 into seal cavity 332 and against air bearing surface 306 thus forming a seal between air bearing body 302 and slide 304.

A seal mounting plate 336 is used to facilitate mounting of seal 330 within seal cavity 332. Generally, seal 330 including seal spring 334 are placed within seal cavity 332.

Seal mounting plate 336 is mounted, e.g., with bolts, to air bearing body 302 thus mounting seal 330 including seal spring 334 within seal cavity 332.

During use, pressurized gas is supplied to pressurized gas inlet port 312. This pressurized gas flows through channel 314 to distributor 318. From distributor 318, the pressurized gas flows to an air bearing region 326, sometimes called a seal region, between air bearing surface 316 of air bearing body 302 and air bearing surface 306 of slide 304. In this manner, pressurized gas is supplied to air bearing region 326.

Due to this pressurized gas, slide 304 floats on air bearing body 302. Stated another way, a layer of gas, sometimes called an air bearing, is located between air bearing surface 306 of slide 304 and air bearing surface 316 of air bearing body 302. Accordingly, slide 304 moves on a layer of gas thus avoiding particulate generation due to friction between slide 304 and air bearing body 302. The pressurized gas is continuously supplied to air bearing region 326 to maintain the air bearing as indicated by arrows 328.

As pressurized gas is supplied to pressurized gas inlet port 312, vacuum is simultaneously supplied to vacuum port 320. This vacuum draws a vacuum through channel 322 to collector 324. In this manner, vacuum is supplied to collector 324.

Collector 324 captures the pressurized gas escaping from air bearing region 326. Thus, the pressurized gas escaping from air bearing region 326 is prevented from entering a clean area 340. For example, clean area 340 is an area, sometimes called a region or volume, having essentially no particulates in which substrates, e.g., silicon wafers, are transferred or otherwise handled.

Since the pressurized gas from air bearing region 326 is prevented from entering clean area 340, any possibility of particulate contamination from particulates entrained within the pressurized gas is eliminated. More particularly, collector 324 captures any particulates entrained with the pressurized gas. This is in contrast to a prior art air bearing where the pressurized gas, which escaped from the air bearing region, entrained particulates into the clean area within the vicinity of the air bearing. These particulates were a significant source of particulate contamination in the prior art.

Further, since pressurized gas escaping from air bearing region 326 is prevented from entering clean area 340, any possibility of the pressurized gas dislodging and moving about particulates within clean area 340 is eliminated. This is in contrast to a prior art air bearing where the pressurized gas, which escaped from the air bearing region into the clean area, had a tendency to dislodge and move about particulates in the clean area within the vicinity of the air bearing. These particulates were also a significant source of particulate contamination in the prior art.

Since distributor 318 is between collector 324 and seal 330, pressurized gas in air bearing region 326 also flows against seal 330. However, as discussed above, seal 330 forms a seal between air bearing body 302 and slide 304 preventing the pressurized gas from escaping past seal 330. Further, to the extent any pressurized gas does escape past seal 330, the pressurized gas and entrained particulates enter into a dirty area 342. For example, dirty area 342 is an area, sometimes called a region or volume, having a greater tolerance to particulates, e.g., an area in which motors or other particulate generating machinery is located. Accordingly, some leakage of pressurized gas past seal 330 is acceptable.

In an alternative embodiment, instead of seal 330, a second collector similar to collector 324 is supplied and coupled to vacuum, e.g., coupled to vacuum port 320 and/or channel 322. By locating distributor 318 between collector 324 and the second collector, pressurized gas from air bearing region 326 is prevented from escaping into clean area 340 or dirty area 342.

Although a cylindrical slide 304 is described, in light of this disclosure, those of skill in the art will understand that slide 304 has other shapes in other embodiments, e.g., is rectangular. Further, in one embodiment, instead of having slide 304 move, slide 304 is held stationary while air bearing body 302 moves. Alternatively, both slide 304 and air bearing body 302 simultaneously move. Generally, slide 304 moves with respect to air bearing body 302.

In an alternative embodiment, slide 304 and air bearing body 302 are stationary and do not move with respect to one another. In accordance with this embodiment, air bearing 300 functions as a seal instead of as an air bearing. Air bearing 300 prevents particulates and gas in dirty region 342 from passing between air bearing body 302 and slide 304 and entering clean area 340.

Since air bearing region 326 is supplied with pressurized gas from distributor 318, air bearing region 326 is at a higher pressure than dirty area 342. Thus, to the extent that gas leaks past seal 330, the leaking gas is pressurized gas from air bearing region 326 and not gas from dirty region 342. This prevents gas and particulates from dirty region 342 from entering into air bearing region 326.

Further, even if gas and particulates do enter air bearing region 326, the gas and particulates are captured by collector 324 and prevented from escaping into clean area 340. In the above manner, air bearing 300 forms a seal between air bearing body 302 and slide 304.

In one embodiment, dirty area 342 is filled with a first gas, e.g., ambient air, and clean area 340 is filled with a second gas, e.g., nitrogen or hydrogen. In accordance with this embodiment, air bearing 300 forms a seal between air bearing body 302 and slide 304 which prevents the first gas from entering into clean area 340 and also prevents the second gas from entering into dirty area 342. Thus, air bearing 300 is used as a seal to prevent gas leakage, i.e., leakage of the first gas from dirty area 342 and the second gas from clean area 340, between air bearing body 302 and slide 304. In light of this disclosure, those of skill in the art will understand that air bearing 300 can be used as a seal to prevent leakage of gas, liquid, or solid materials.

In another embodiment, slide 304 is supported by mechanical bearings (not shown in FIG. 3) on air bearing body 302. In accordance with this embodiment, the mechanical bearings facilitate the motion of slide 304 with respect to air bearing body 302 and air bearing 300 is not used as an air bearing. However, air bearing 300 still functions as a seal between dirty area 342 and clean area 340 as described above. Further, any particulates adhered to air bearing surface 306 of slide 304 are blasted with pressurized gas from distributor 318 as the particulates move past distributor 318. This blast of pressurized gas dislodges the particulates from air bearing surface 306. These particulates are captured by collector 324 and prevented from entering into clean area 340.

Figure 4:
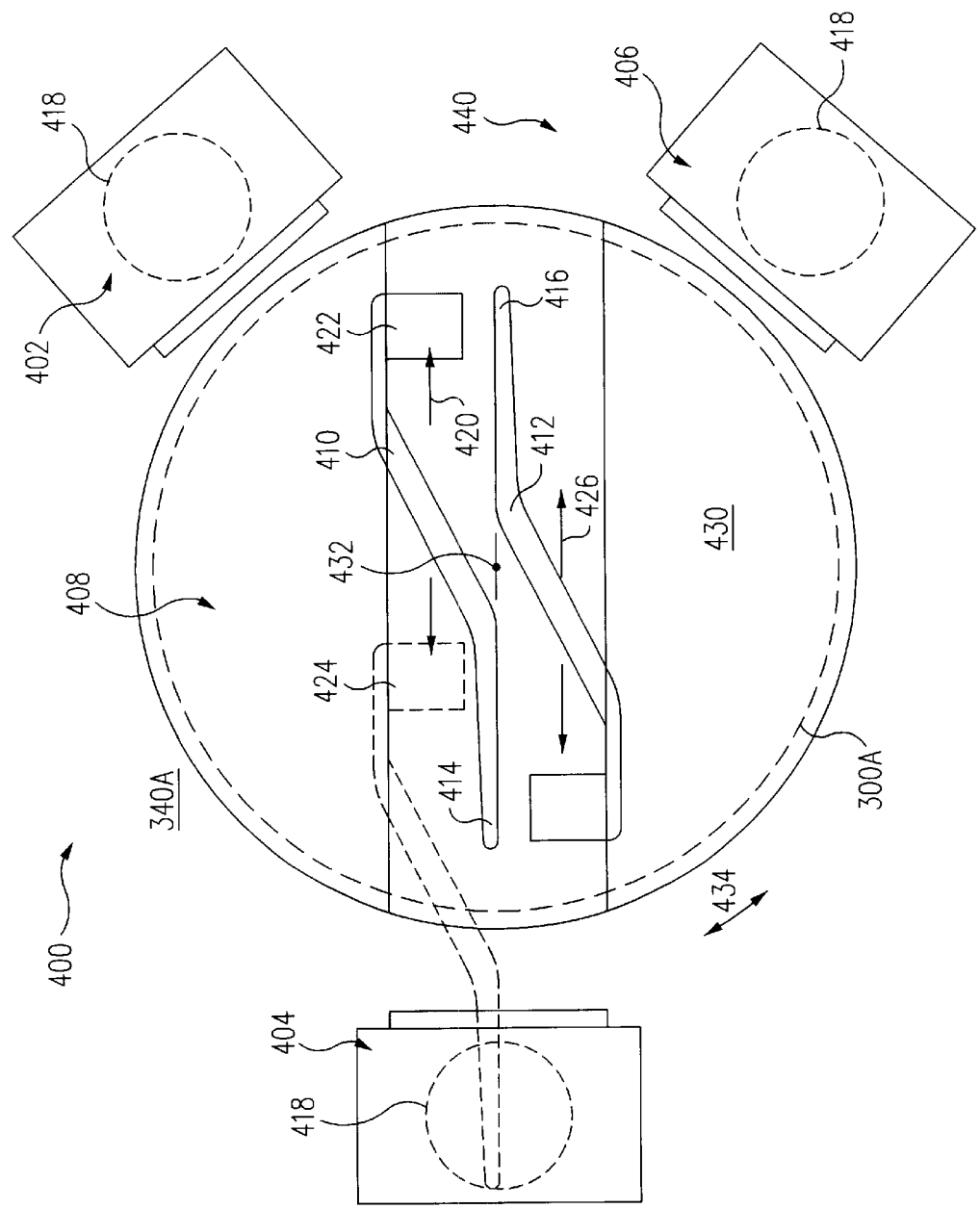
FIG. 4 is a top plan view of a semiconductor processing system in accordance with the present invention.

FIG. 4 is a top plan view of a semiconductor processing system 400 in accordance with the present invention. Generally, system 400 includes a load station 402, a semiconductor processing reactor 404, an unload station 406, and a wafer handling apparatus 408, sometimes called a robot.

Generally, substrates 418 such as silicon wafers (indicated in dashed lines), which are to be processed in reactor 404, are held, e.g., in a wafer cassette, in load station 402. Substrates 418 are processed in reactor 404. Substrates 418, which have been processed in reactor 404, are held, e.g., in a wafer cassette, in unload station 406. Wafer handling apparatus 408 moves substrates 418 between load station 402, reactor 404, and unload station 406.

Wafer handling apparatus 408 includes a first robot arm 410 and a second robot arm 412. First robot arm 410 and second robot arm 412 include a first end effector 414 and a second end effector 416, respectively. As those of skill in the art will understand, vacuum is selectively supplied to end effectors 414, 416, which selectively grab and release substrates 418.

To illustrate the operation of robot arms 410, 412, referring now to robot arm 410, robot arm 410 is capable of moving back and forth in one direction, i.e., along a linear axis 420 of robot arm 410, and so robot arm 410 is often referred to as a linear robot. More particularly, robot arm 410 moves from a retracted position 422 to an extended position 424 (indicated in dashed lines). When robot arm 410 is at retracted position 422, robot arm 410 is retracted. Conversely, when robot arm 410 is at extended position 424, robot arm 410 is extended. Robot arm 412 moves along a linear axis 426 of robot arm 412 in a manner similar to that described above for robot arm 410.

Robot arms 410, 412 are supported by a robot pedestal 430. Robot pedestal 430 rotates around a longitudinal axis 432 of robot pedestal 430 as indicated by arrow 434. Further, robot pedestal 430 moves downwards, e.g., in a first direction, and upwards, e.g., in a second direction, along longitudinal axis 432, i.e., moves in and out of the plane of the page of FIG. 4.

To illustrate the operation of system 400, initially, substrates 418 to be processed are loaded, e.g., within a wafer carrier, into load station 402. Robot pedestal 430 rotates such that robot arm 410, which is retracted, is aligned to enter load station 402. Robot arm 410 is extended to reach into load station 402. Robot pedestal 430 is moved downwards (or upwards) to place end effector 414 against a first substrate 418 of the plurality of substrates 418. Vacuum is supplied to end effector 414, which grabs first substrate 418. Robot pedestal 430 is moved upwards (or downwards) to remove first substrate 418 from the wafer carrier. Robot arm 410 is retracted to remove first substrate 418 from load station 402.

Robot pedestal 430 rotates counterclockwise to align robot arm 410 with reactor 404. Robot arm 410 is extended to move first substrate 418 into reactor 404. Robot pedestal 430 is moved downwards (or upwards) to load first substrate 418 into reactor 404. Vacuum is shut off from end effector 414, which releases first substrate 418. Robot arm 410 is retracted out of reactor 404. First substrate 418 is processed in reactor 404 in a conventional manner.

Robot arm 410 is extended into reactor 404. Vacuum is supplied to end effector 414, which grabs first substrate 418. Robot pedestal 430 is moved upwards (or downwards) to unload first substrate 418 from reactor 404. Robot arm 410 is retracted to move first substrate 418 out of reactor 404.

Robot pedestal 430 is rotated to align robot arm 412 with load station 402. Robot arm 412 removes a second substrate 418 of the plurality of substrates 418 from load station 402 in a manner similar to that described above with regards to robot arm 410.

Robot pedestal 430 is rotated to align robot arm 410 with unload station 406. Robot arm 410 is extended to move first substrate 418 into unload station 406.

Robot pedestal 430 is moved downwards (or upwards) to load first substrate 418 into the wafer carrier in unload station 406. Vacuum is shut off from end effector 414, which releases first substrate 418. Robot arm 410 is retracted out of unload station 406.

Robot pedestal 430 is rotated counterclockwise to align robot arm 412 with reactor 404. Robot arm 412 loads second substrate 418 into reactor 404, second substrate 418 is processed in reactor 404, and robot arm 412 unloads second substrate 418 from reactor 404 in a manner similar to that described above with regards to robot arm 410.

Robot pedestal 430 is rotated counterclockwise to align robot arm 410 with load station 402. Robot arm 410 removes a third substrate 418 of the plurality of substrates 418 from load station 402 in the same manner as that described above. Robot pedestal 430 is rotated counterclockwise to align robot arm 412 with unload station 406. Robot arm 412 loads second substrate 418 into unload station 406 in a manner similar to that described above with regards to robot arm 410. This procedure is repeated until all of substrates 418 are processed.

Although not described above, those of skill in the art will understand that load station 402, reactor 404, and unload station 406 typically have load doors and that these load doors are selectively opened and closed during loading and unload of substrates 418 into load station 402, reactor 404, and unload station 406. Further, although a particular operation of system 400 is described above, those of skill in the art will understand that system 400 can be operated in a variety of different manners depending upon the particular configuration of load station 402, reactor 404, and unload station 406. The particular operation of system is not essential to the invention.

Further, although system 400 is described as including load station 402, reactor 404, and unload station 406, in light of this disclosure, those of skill in the art will understand that system 400 can include additional stations, reactors and/or other equipment instead of, or in addition to, load station 402, reactor 404, and/or unload station 406.

Generally, substrates 418 are handled by wafer handling apparatus 408 in a clean area 340A. Clean area 340A is defined by a tabletop 440. In accordance with the present invention, an air bearing 300A between robot pedestal 430 and tabletop 440 provides a seal between robot pedestal 430 and tabletop 440.

Figure 5:
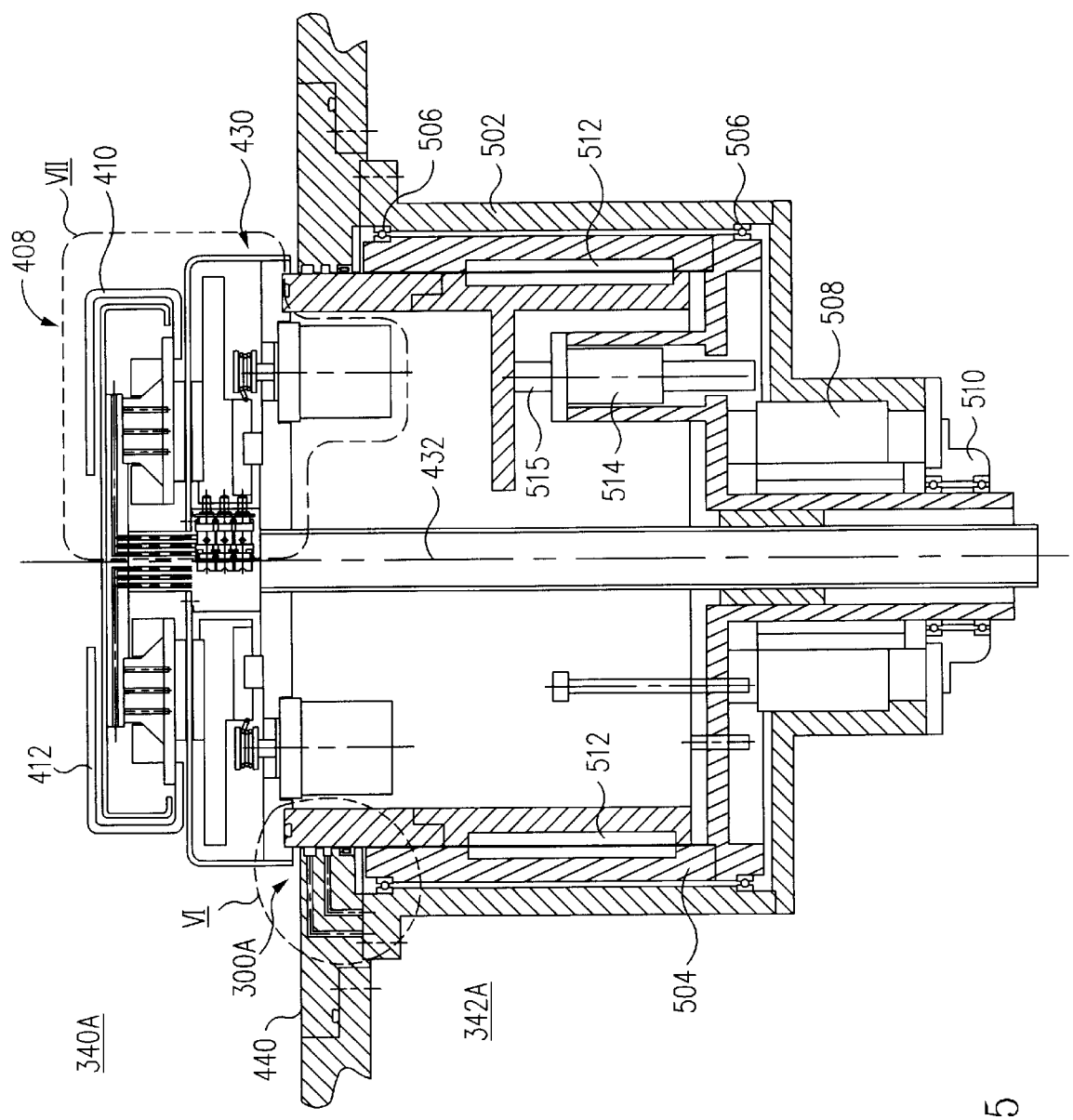
FIG. 5 is a cross-sectional view of a wafer handling apparatus in accordance with the present invention.

FIG. 5 is a cross-sectional view of wafer handling apparatus 408 in accordance with the present invention. Referring now to FIG. 5, wafer handling apparatus 408 includes an outer housing 502. An inner housing 504 is mounted to outer housing 502 by bearings 506. Bearings 506 allow inner housing 504 to rotated around longitudinal axis 432. A theta motor 508 coupled to inner housing 504 controls this rotation of inner housing 504. A rotary encoder 510 facilitates this rotation in a conventional manner.

Robot pedestal 430 is mounted to inner housing 504 by linear bearings 512. Linear bearings 512 allow robot pedestal 430 to move along longitudinal axis 432, i.e., up and down in the view of FIG. 5. This movement is hereinafter referred to as a longitudinal motion. A z-axis motor 514 is mounted to inner housing 504 and has a piston 515 mounted to robot pedestal 430. Z-axis motor 514 controls the extension and retraction of piston 515 and thus controls the longitudinal motion of robot pedestal 430.

Figure 6:
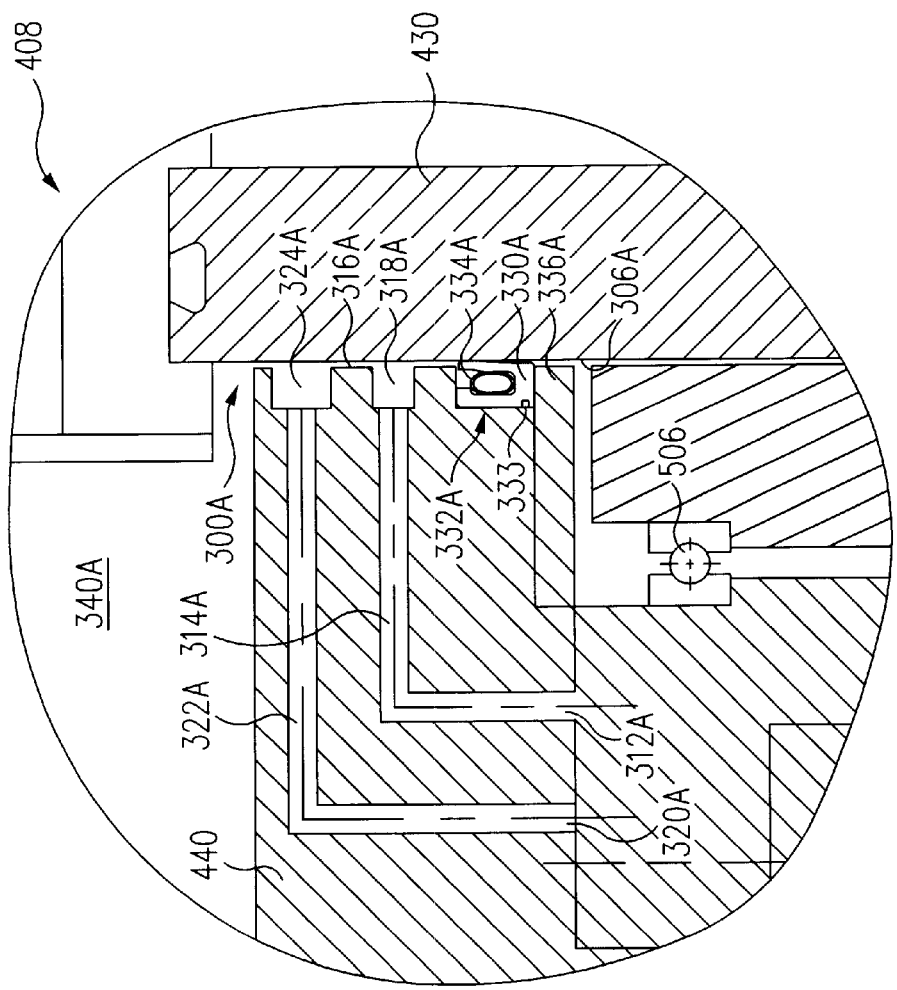
FIG. 6 is an enlarged cross-sectional view of the region VI of the wafer handling apparatus of FIG. 5.

FIG. 6 is an enlarged cross-sectional view of the region VI of wafer handling apparatus 408 of FIG. 5. Referring now to FIG. 6, air bearing 300A between robot pedestal 430 and tabletop 440 is illustrated. In accordance with this embodiment, tabletop 440, e.g., the air bearing body, remains stationary. Robot pedestal 430, e.g., a slide, moves along longitudinal axis 432 and rotates around longitudinal axis 432 as described above.

Air bearing surface 306A, pressurized gas inlet port 312A, channel 314A, air bearing surface 316A, distributor 318A, vacuum port 320A, channel 322A, collector 324A, seal 330A, seal cavity 332A, seal spring 334A and seal mounting plate 336A of wafer handling apparatus 408 are substantially similar to air bearing surface 306, pressurized gas inlet port 312, channel 314, air bearing surface 316, distributor 318, vacuum port 320, channel 322, collector 324, seal 330, seal cavity 332, seal spring 334 and seal mounting plate 336 of air bearing 300 of FIG. 3 and so are not discussed further to avoid detracting from the principals of the invention. An exception being that seal 330A includes an O-ring 333 between seal 330A and tabletop 440 to enhance the seal formed between seal 330A and tabletop 440.

Generally, air bearing 300A between robot pedestal 430 and tabletop 440 forms a seal which prevents particulates from escaping between robot pedestal 430 and tabletop 440 as robot pedestal 430 moves.

Referring again to FIG. 5, an enclosure is formed by tabletop 440, air bearing 300A, and robot pedestal 430. Advantageously, this enclosure isolates clean area 340A from a dirty area 342A. As described above in reference to FIG. 4, substrates 418 are processed and otherwise handled in clean area 340A, which is essentially particulate free. In contrast, theta motor 508, z-axis motor 514, and other particulate generating machinery are located in dirty area 342A, which has a higher tolerance to particulate contamination.

Figure 7:
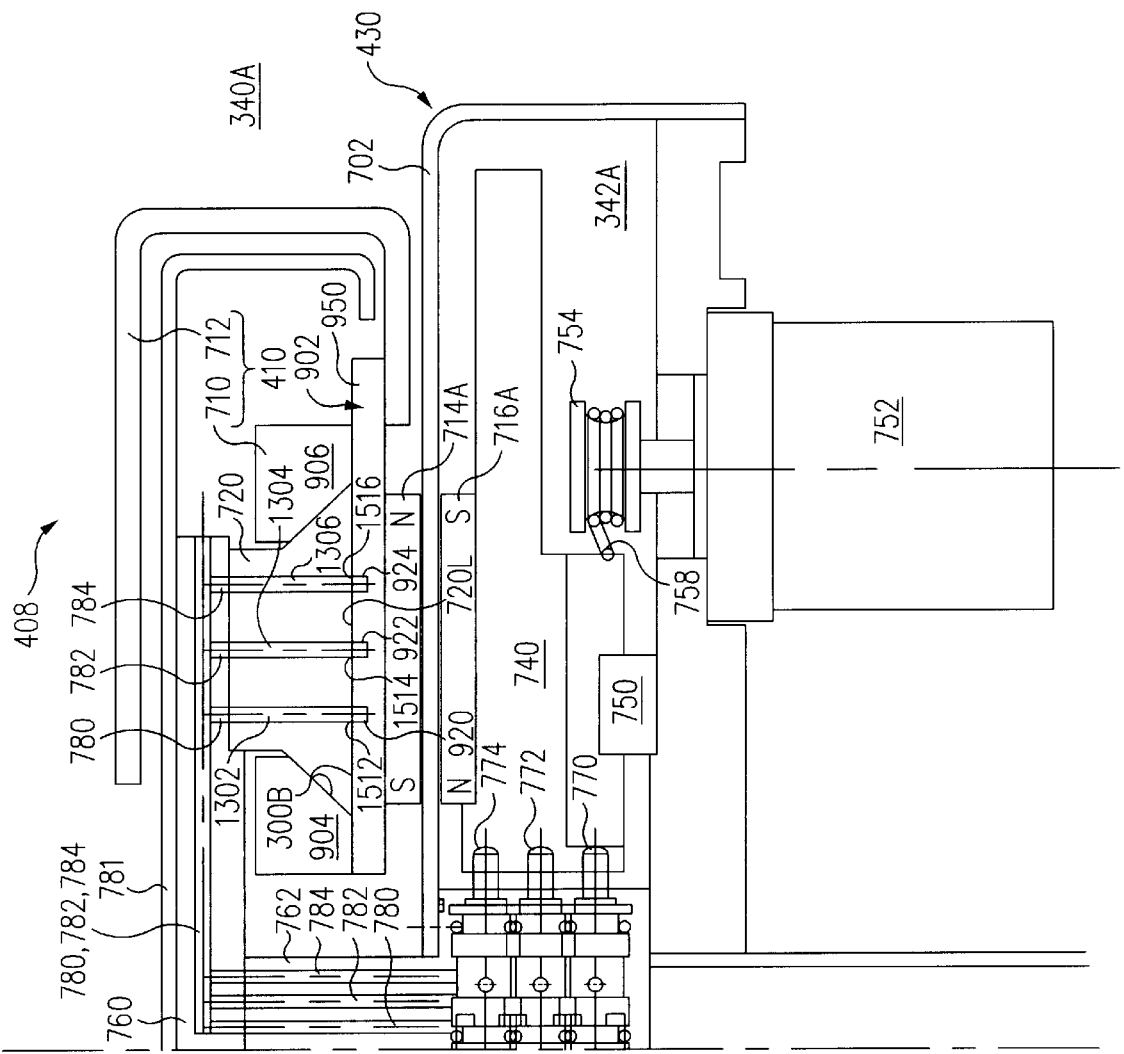
FIG. 7 is an enlarged cross-sectional view of the region VII of the wafer handling apparatus of FIG. 5.
Figure 8:
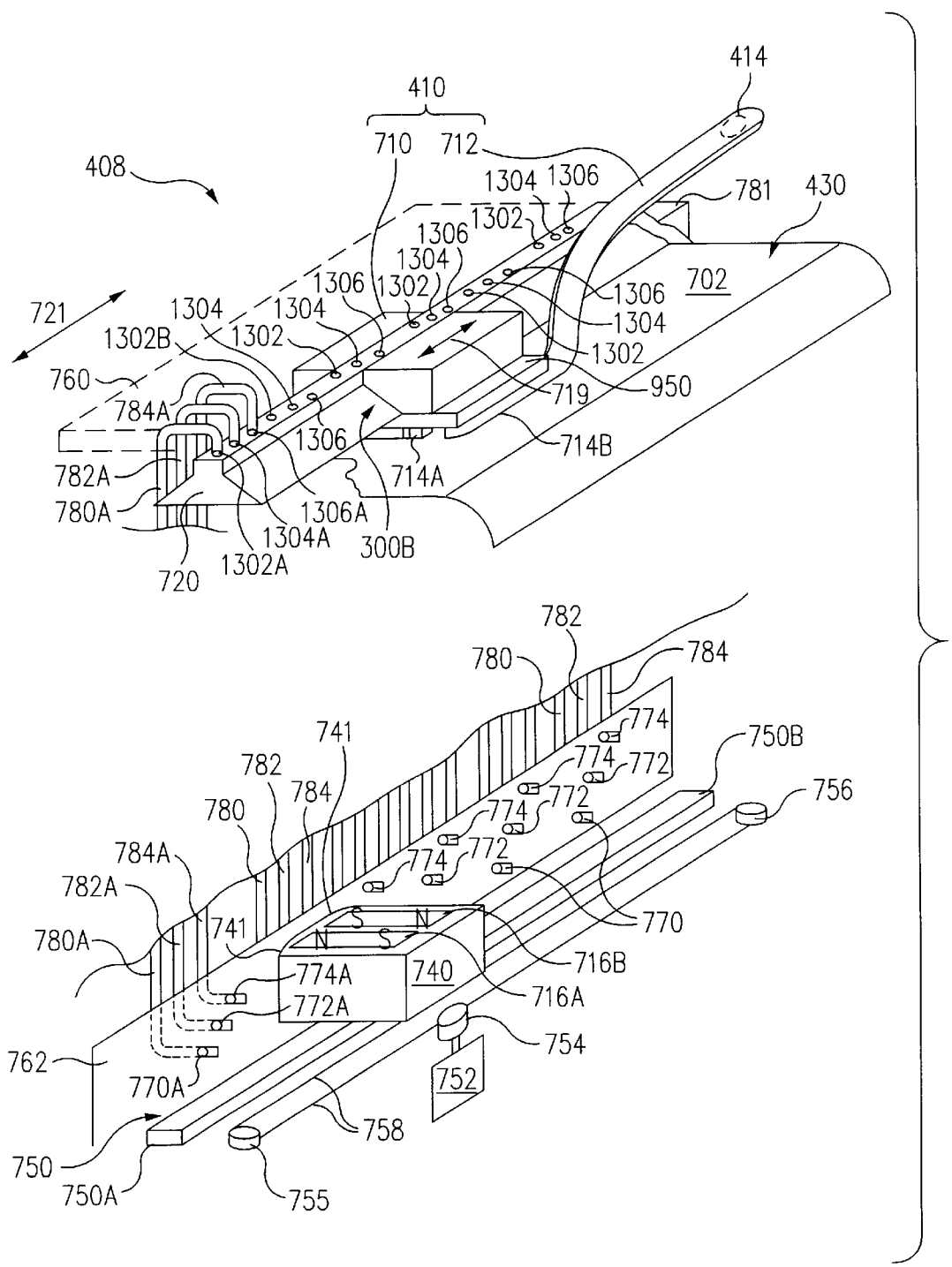
FIG. 8 is a partially exploded perspective view of the wafer handling apparatus of FIG. 7.

FIG. 7 is an enlarged cross-sectional view of the region VII of wafer handling apparatus 408 of FIG. 5. FIG. 8 is a partially exploded perspective view of wafer handling apparatus 408 of FIG. 7. Referring now to FIGS. 7 and 8 together, robot pedestal 430 includes a cover 702. Cover 702 separates clean area 340A from dirty area 342A. Robot arm 410 is adjacent cover 702 and is located in clean area 340A.

Robot arm 410 includes a slide 710 and an end effector arm 712 mounted to slide 710, e.g., with bolts. Slide 710 is supported on a hanger 720, e.g., an air bearing body. As discussed in greater detail below, an air bearing 300B between slide 710 and hanger 720 allows slide 710 to freely move along linear axis 420 of robot arm 410.

Slide 710 is magnetically coupled to a truck 740 such that linear motion of truck 740 produces a corresponding linear motion of slide 710. More particularly, imbedded in slide 710 are a plurality of outer magnets 714A–714B. In particular, two outer magnets 714A–714B, collectively referred to as outer magnets 714, are imbedded in slide 710. Outer magnets 714 are completely enclosed within slide 710. Alternatively, surfaces of outer magnets 714 are exposed and are flush with, recessed from or extended from slide 710.

Outer magnets 714 are arranged so that each of outer magnets 714 has a magnetic polarity opposite that of the adjacent magnets of outer magnets 714. For example, outer magnet 714A is aligned with its north pole towards end effector arm 712. Conversely, outer magnet 714B is aligned with its south pole towards end effector arm 712.

Truck 740 includes a plurality of inner magnets 716A–716B. In particular, two inner magnets 716A–716B, collectively referred to as inner magnets 716, are imbedded in truck 740. Inner magnets 716 are completely enclosed within truck 740. Alternatively, surfaces of inner magnets 716 are exposed and are flush with, recessed from or extended from truck 740.

Each of outer magnets 714 is located adjacent, and has a magnetic polarity opposite that of a different inner magnet 716, sometimes called a corresponding inner magnet. For example, outer magnet 714A is aligned with its north pole towards end effector arm 712 and the corresponding inner magnet 716A is aligned with its south pole towards end effector arm 712.

Since opposite poles attract, outer magnet 714A is magnetically coupled to inner magnet 716A. More generally, each outer magnet 714 is magnetically coupled to its corresponding inner magnet 716. Since outer magnets 714 are imbedded in slide 710 and inner magnets 716 are imbedded in truck 740, slide 710 is magnetically coupled to truck 740 through cover 702. Accordingly, linear motion of truck 740 produces an equal linear motion of slide 710 and, more generally, robot arm 410. Slide 710 slides along a linear axis 721 of hanger 720, i.e., along the length of hangar 720. Stated another way, slide 710 has a linear axis 719 parallel to linear axis 721 of hanger 720, and slide 710 moves back and forth along linear axis 719.

Although two outer magnets 714 and two corresponding inner magnets 716 are set forth, in light of this disclosure, it is understood that more or less than two outer magnets 714 and corresponding inner magnets 716 can be used.

Advantageously, slide 710 is coupled to truck 740 without physically passing a structure through cover 702. In this manner, the integrity and dependability of cover 702 as a particulate-tight enclosure is insured.

Truck 740 is mounted on a linear rail 750 by a bearing (not shown). Advantageously, since truck 740 is located in dirty area 342A, the particular type of bearing used is not of any particular importance. Typically, a low cost mechanical, e.g., ball bearing, is used.

The linear position and linear motion of truck 740 on linear rail 750 is controlled by a linear motor 752. Linear motor 752 is located between a first linear end 750A and a second linear end 750B of linear rail 750. Linear motor 752 includes a motor spool 754. Located adjacent first linear end 750A, second linear end 750B of linear rail 750 are a first spool 755 and a second spool 756, respectively. A cable 758 extends in a loop between motor spool 754, first spool 755 and second spool 756. Cable 758 is attached to truck 740 between first spool 755 and second spool 756. Linear motor 752 rotates motor spool 754 and moves cable 758 thus positioning and controlling the motion of truck 740.

In the above manner, linear motor 752 controls the linear position and linear motion of truck 740. Since truck 740 is magnetically coupled to slide 710, linear motion of truck 740 causes an equal linear motion of slide 710. Accordingly, linear motor 752 controls the linear position and linear motion of slide 710. Advantageously, slide 710 is moved in clean area 340A by linear motor 752, which is in dirty area 342A. Thus, slide 710 is moved without introducing any particulate from linear motor 752 into clean area 340A. Further, slide 710 moves on hanger 720 on an air bearing 300B, without generating any particulates.

Figure 9:
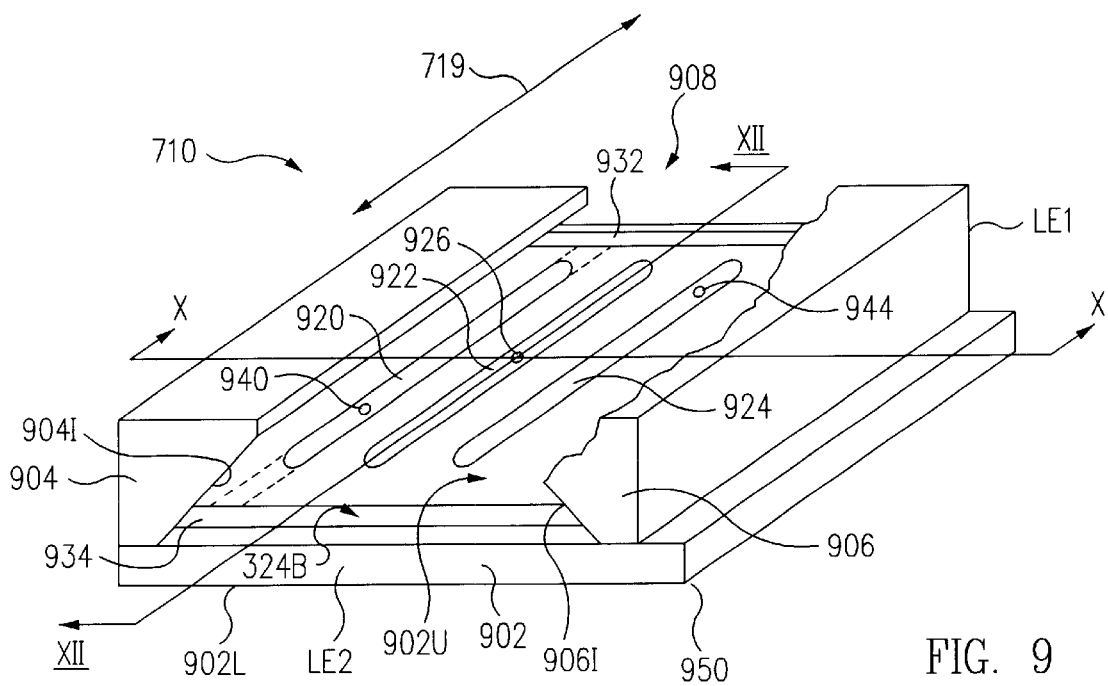
FIG. 9 is a perspective of a slide in accordance with one embodiment of the present invention.

FIG. 9 is a perspective of slide 710 in accordance with one embodiment of the present invention. FIG. 10 is a cross-sectional view of slide 710 along the line X—X of FIG. 9. Referring to FIGS. 9 and 10 together, slide 710 includes a base 902, a first side member 904 and a second side member 906.

In this embodiment, side members 904 and 906 are mounted, e.g., with bolts, to base 902. However, in an alternative embodiment, side members 904, 906, and base 902 are integral, i.e., are a single piece and not a plurality of separate pieces connected together. Illustratively, side members 904, 906, and base 902 are metal, e.g., stainless-steel.

Side members 904, 906, and base 902 define a pocket 908. More particularly, an upper, e.g., first, surface 902U of base 902, an interior, e.g., first, surface 904I of side member 904, and an interior, e.g., first, surface 906I of side member 906 define pocket 908. Upper surface 902U, interior surface 904I, and interior surface 906I are parallel to linear axis 719 of slide 710.

Referring now to FIGS. 7 and 10, the cross-sectional shape of pocket 908 along a plane perpendicular to linear axis 719, i.e., the shape of pocket 908 in the view of FIG. 10, corresponds to the cross-sectional shape of hanger 720 along the same plane. In this embodiment, the cross-sectional shape of pocket 908 and hanger 720 is trapezoidal, however, in other embodiments, the cross-sectional shape of pocket 908 and hanger 720 has a different shape. Generally, hanger 720 fits into pocket 908 thus supporting slide 710 on hanger 720.

FIG. 11 is a top plan view of slide 710 of FIG. 9. Referring now to FIGS. 9, 10 and 11 together, base 902 includes a vacuum coupler trench 920, a pressurized gas coupler trench 922, and an end effector vacuum coupler trench 924. Trenches 920, 922, and 924 are parallel in length to linear axis 719 of slide 710.

As discussed in greater detail below, vacuum is continuously supplied to vacuum coupler trench 920 from hanger 720, pressurized gas is continuously supplied to pressurized gas coupler trench 922 from hanger 720, and vacuum is selectively supplied to end effector vacuum coupler trench 924 from hanger 720.

FIG. 12 is a cross-sectional view of slide 710 along the line XII—XII of FIG. 9. As set forth above, pressurized gas is continuously supplied to pressurized gas coupler trench 922. Pressurized gas coupler trench 922 serves as a distributor to distribute the pressurized gas between upper surface 902U and hanger 720. In this manner, air bearing 300B (see FIG. 7) is formed between upper surface 902U and hanger 720.

Referring now to FIGS. 10 and 12 together, pressurized gas coupler trench 922 is coupled to a first distributor 318B in interior surface 904I. In this embodiment, the length of distributor 318B is parallel to linear axis 719.

More particularly, an aperture 926 located within pressurized gas coupler trench 922 is coupled to a channel 314B. Channel 314B extends through base 902, through side member 904, and to an aperture 928 in distributor 318B. Thus, pressurized gas supplied to pressurized gas coupler trench 922 is also supplied to distributor 318B. Distributor 318B distributes the pressurized gas between interior surface 904I and hanger 720. In this manner, air bearing 300B (see FIG. 7) is formed between interior surface 904I and hanger 720.

Similarly, referring now to FIG. 10, pressurized gas coupler trench 922 is coupled to a first distributor 318C in interior surface 906I. In this embodiment, the length of distributor 318C is parallel to linear axis 719.

More particularly, aperture 926 located within pressurized gas coupler trench 922 is coupled to a channel 314C. Channel 314C extends through base 902, through side member 906, and to an aperture 930 in distributor 318C. Thus, pressurized gas supplied to pressurized gas coupler trench 922 is also supplied to distributor 318C. Distributor 318C distributes the pressurized gas between interior surface 906I and hanger 720. In this manner, air bearing 300B (see FIG. 7) is formed between interior surface 906I and hanger 720.

Thus, upper surface 902U, interior surface 904I and interior surface 906I collectively form an air bearing surface 316B. Of importance, the entire periphery of air bearing surface 316B is lined with a collector 324B.

In this embodiment, collector 324B is defined by a first trench 932 and a second trench 934 in upper surface 902U (FIGS. 9, 11, 12), a first trench 936 in interior surface 904I (FIGS. 10, 12) and a first trench 938 in interior surface 906I (FIG. 10). Trenches 932, 934, 936, and 938 are coupled to one another and collectively form collector 324B.

Referring now to FIGS. 9 and 11 together, slide 710 has a first linear end LE1 at a first end of linear axis 719 and a second linear end LE2 opposite linear end LE1 and at a second end of linear axis 719. Trench 932 is perpendicular to linear axis 719 and is adjacent to linear end LE1. Similarly, trench 934 is perpendicular to linear axis 719 and is adjacent to linear end LE2.

Referring now to FIG. 12, trench 936 is U-shaped. More particularly trench 936 includes a first vertical portion 936A, a first horizontal portion 936B, and a second vertical portion 936C integral with one another. Vertical portion 936A is perpendicular to linear axis 719 and is adjacent to linear end LE1. Similarly, vertical portion 936C is perpendicular to linear axis 719 and is adjacent to linear end LE2. Conversely, horizontal portion 936B is parallel to linear axis 719 and extends between linear end LE1 and linear end LE2.

Vertical portion 936A is coupled to trench 932 and vertical portion 936C is coupled to trench 934. Horizontal portion 936B is coupled to vertical portions 936A, 936C.

Referring now to FIG. 10, trench 938 is substantially similar, e.g., is a mirror image, to trench 936 and so is not discussed further to avoid detracting from the principals of the invention.

Referring again to FIGS. 9 and 11 together, in one embodiment, vacuum coupler trench 920 extends into trench 932 and/or trench 934 as indicated by the dashed lines. In this manner, vacuum supplied to vacuum coupler trench 920 is supplied to trench 932 and/or trench 934, and thus to collector 324B.

Alternatively, or in addition, vacuum coupler trench 920 is coupled to collector 324B by one or more channels. To illustrate, referring now to FIGS. 9, 11 and 12, an aperture 940 is formed in vacuum coupler trench 920. A channel 322B extends from aperture 940 through base 902, through side member 904, and to an aperture 942 in trench 936. Thus, vacuum supplied to vacuum coupler trench 920 is also supplied to trench 936, and more generally, to collector 324B. It is understood that vacuum is supplied to trench 938 in a similar manner. Further, in light of this disclosure, those of skill in the art will understand that vacuum coupler trench 920 can be selectively coupled to collector 324B at a variety of locations, e.g., to trenches 932, 934, in a similar manner.

Accordingly, the entire periphery of air bearing surface 316B is lined by collector 324B. Advantageously, pressurized gas from pressurized gas coupler trench 922, distributor 318B and distributor 318C, is captured by collector 324B. Thus, any particulates entrained with the pressurized gas do not escape into the vicinity of slide 710, i.e., into clean area 340A.

End effector arm 712 (FIGS. 7 and 8) is mounted, e.g., with bolts, to an end effector extension portion 950 of slide 710. More particularly, referring again to FIGS. 9 and 11, base 902 of slide 710 includes end effector extension portion 950, which extends beyond side member 906 in a direction perpendicular to linear axis 719. Accordingly, end effector extension portion 950 protrudes from slide 710 and end effector arm 712 (FIGS. 7 and 8) is mounted thereto.

An aperture 944 is formed in end effector vacuum coupler trench 924. An aperture 946 is formed in a lower, e.g., second, surface 902L of base 902. Aperture 944 is coupled to aperture 946 by a channel 948 extending through base 902 (aperture 946 and channel 948 are indicated in dashed lines in FIG. 11).

Referring now to FIGS. 8 and 11, aperture 946 is coupled to end effector 414, i.e., by a channel (not shown) extending through end effector arm 712. During use, vacuum is selectively supplied to end effector vacuum coupler trench 924 and thus to end effector 414.

Figure 13:
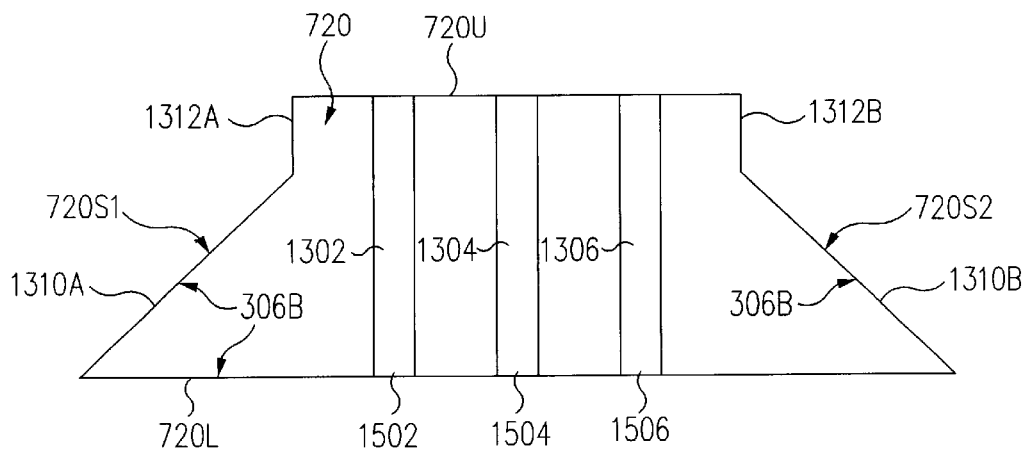
FIG. 13 is a front plan view of a hanger in accordance with one embodiment of the present invention.

FIG. 13 is a front plan view of hanger 720 in accordance with one embodiment of the present invention. Hanger 720 includes a lower, e.g., first, surface 720L and an upper, e.g., second, surface 720U. Extending between upper surface 720U and lower surface 720L are a plurality of vacuum channels 1302, a plurality of pressurized gas channels 1304, and a plurality of end effector vacuum channels 1306. Illustratively, channels 1302, 1304, 1306 are cylindrical and are formed by drilling through hanger 720.

Hanger 720 further includes a side, e.g., third, surface 720S1 and a side, e.g., fourth, surface 720S2. Side surfaces 720S1, 720S2 extend between upper surface 720U and lower surface 720L. Side surface 720S1 includes an angled portion 1310A, which extends at an angle inwards from lower surface 720L. Side surface 720S1 also includes a vertical portion 1312A, which extends vertically from angled portion 1310A to upper surface 720U. Side surface 720S2 is substantially similar to side surface 720S1 and includes an angled portion 1310B and a vertical portion 1312B.

Collectively, lower surface 720L, angled portion 1310A of side surface 720S1 and angled portion 1310B of side surface 720S2 form a second air bearing surface 306B, complementary to air bearing surface 316B of slide 710.

Figure 14:
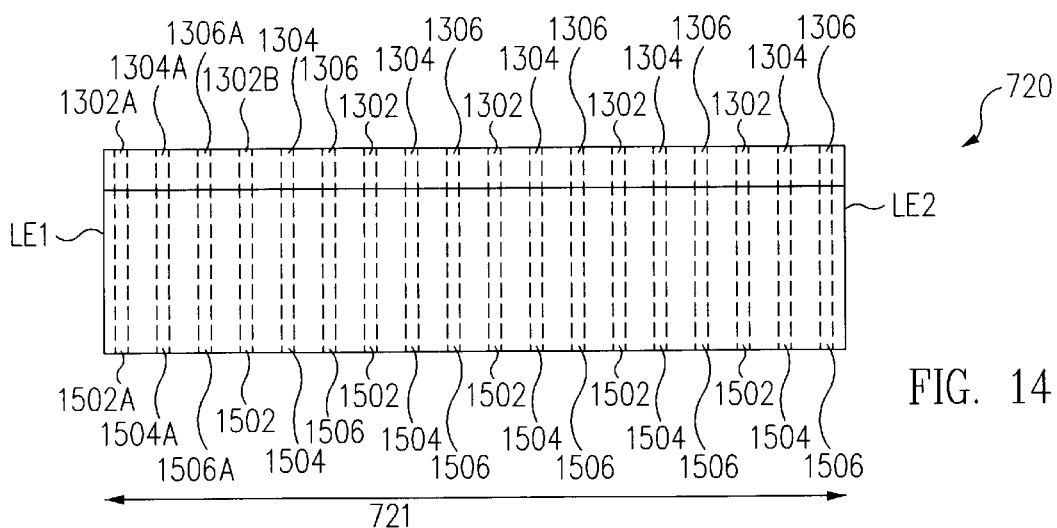
FIG. 14 is a side plan view of the hanger of FIG. 13.

FIG. 14 is a side plan view of hanger 720 of FIG. 13. As shown in FIG. 14, a repetitive pattern of channels 1302, 1304, 1306 is formed along linear axis 721 of hanger 720. To illustrate, a first vacuum channel 1302A of the plurality of vacuum channels 1302 is formed adjacent to linear end LE1 of hanger 720. A first pressurized gas channel 1304A of the plurality of pressurized gas channels 1304 is formed adjacent vacuum channel 1302A. A first end effector vacuum channel 1306A of the plurality of end effector vacuum channels 1306 is formed adjacent pressurized gas channel 1304A. A second vacuum channel 1302B of the plurality of vacuum channels 1302 is formed adjacent end effector vacuum channel 1306A. This pattern is repeated along linear axis 721 from linear end LE1 to a second linear end LE2 of hanger 720 opposite linear end LE1.

Figure 15:
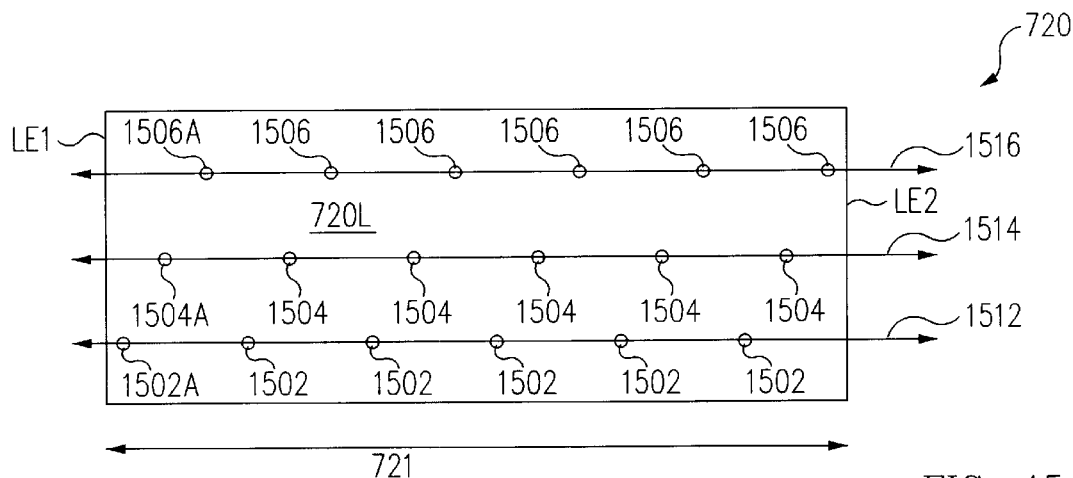
FIG. 15 is a bottom plan view of the hanger of FIG. 13.

FIG. 15 is a bottom plan view of hanger 720 of FIG. 13. Referring now to FIGS. 14 and 15 together, vacuum channels 1302 extend to corresponding apertures 1502 in lower surface 720L of hanger 720, pressurized gas channels 1304 extend to corresponding apertures 1504 in lower surface 720L of hanger 720, and end effector vacuum channels 1306 extend to corresponding apertures 1506 in lower surface 720L of hanger 720.

To illustrate, vacuum channel 1302A extends to a first aperture 1502A of the plurality of apertures 1502. Pressurized gas channel 1304A extends to a first aperture 1504A of the plurality of apertures 1504. End effector vacuum channel 1306A extends to a first aperture 1506A of the plurality of apertures 1506. The other vacuum channels 1302 extend to the other corresponding apertures 1502, the other pressurized gas channels 1304 extend to the other corresponding apertures 1504, and the other end effector vacuum channels 1306 extend to the other corresponding apertures 1506 in a similar manner and so are not discussed further to avoid detracting from the principals of the invention.

Apertures 1502 lie upon a line 1512, which is parallel to linear axis 721 of hanger 720. Apertures 1504 lie upon a line 1514, which is parallel to linear axis 721 of hanger 720. Apertures 1506 lie upon a line 1516, which is parallel to linear axis 721 of hanger 720.

Referring again to FIG. 7, the lengths of vacuum coupler trench 920, pressurized gas coupler trench 922 and end effector vacuum coupler trench 924 are aligned with and slide along lines 1512, 1514, 1516, respectively.

Hanger 720 is mounted, e.g., with bolts, to a gas manifold 760 (FIGS. 7 and 8). A cover 781 is mounted to gas manifold 760 and extends around slide 710 and hanger 720. Gas manifold 760 is mounted, e.g., with bolts, to a gas manifold column 762.

Gas manifold column 762 includes a plurality of vacuum switches 770, a plurality of pressurized gas switches 772, and a plurality of end effector vacuum switches 774. Formed, e.g., by drilling, in gas manifold column 762 and gas manifold 760 are a plurality of vacuum lines 780, pressurized gas lines 782, and end effector vacuum lines 784.

Vacuum switches 770 are coupled to corresponding vacuum channels 1302 by corresponding vacuum lines 780. To illustrate, a first vacuum switch 770A (FIG. 8) of the plurality of vacuum switches 770 is coupled to vacuum channel 1302A by a first vacuum line 780A of the plurality of vacuum lines 780. Vacuum switch 770A is also coupled to a vacuum source as described in greater detail below with reference to FIGS. 16, 17 and 18. When activated, vacuum switch 770A couples the vacuum source to vacuum channel 1302A. The other vacuum switches 770 are coupled in parallel to the vacuum source and are also coupled to the other corresponding vacuum channels 1302 by the other corresponding vacuum lines 780 in a similar manner.

Pressurized gas switches 772 are coupled to corresponding pressurized gas channels 1304 by corresponding pressurized gas lines 782. To illustrate, a first pressurized gas switch 772A of the plurality of pressurized gas switches 772 is coupled to pressurized gas channel 1304A by a first pressurized gas line 782A of the plurality of pressurized gas lines 782. Pressurized gas switch 772A is also coupled to a pressurized gas source as described in greater detail below with reference to FIGS. 16, 17 and 18. When activated, pressurized gas switch 772A couples the pressurized gas source to pressurized gas channel 1304A. The other pressurized gas switches 772 are coupled in parallel to the pressurized gas source and are also coupled to the other corresponding pressurized gas channels 1304 by the other corresponding pressurized gas lines 782 in a similar manner End effector vacuum switches 774 are coupled to corresponding end effector vacuum channels 1306 by corresponding end effector vacuum lines 784. To illustrate, a first end effector vacuum switch 774A of the plurality of end effector vacuum switches 774 is coupled to end effector vacuum channel 1306A by a first end effector vacuum line 784A of the plurality of end effector vacuum lines 784.

As described in greater detail below with reference to FIGS. 16, 17 and 18, end effector vacuum switch 774A is also selectively coupled and decoupled from an end effector vacuum source. When vacuum is to be supplied to end effector 414, e.g., when end effector 414 is used to grab a substrate 418, the end effector vacuum source is coupled to end effector vacuum switch 774A. However, when no vacuum is to be supplied to end effector 414, e.g., when end effector 414 is not holding a substrate 418, the end effector vacuum source is decoupled from end effector vacuum switch 774A.

When activated, end effector vacuum switch 774A couples the end effector vacuum source to end effector vacuum channel 1306A or simply opens with no effect, depending upon whether the end effector vacuum source is coupled or decoupled, respectively, to end effector vacuum switch 774A. The other end effector vacuum switches 774, operate in a similar manner and are also coupled to the other corresponding end effector vacuum channels 1306 by the other corresponding end effector vacuum lines 784.

Figure 16:
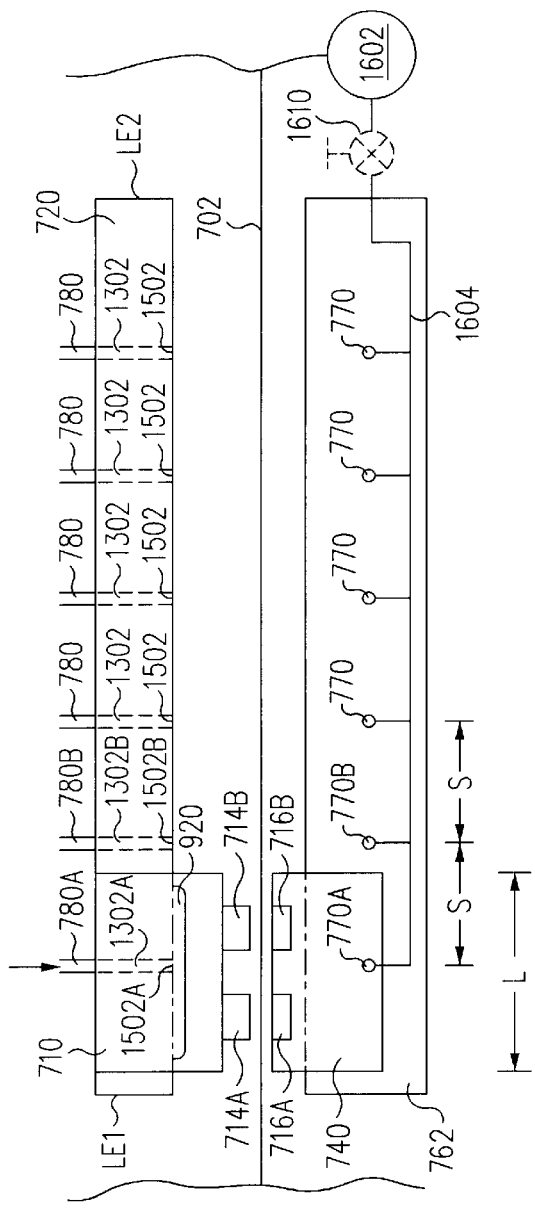
FIGS. 16, 17 and 18 are side plan views of a truck and a slide during use in accordance with one embodiment of the present invention.

FIG. 16 is a side plan view of truck 740 and slide 710 during use in accordance with one embodiment of the present invention. As shown in FIG. 16, vacuum switches 770 are coupled in parallel to a vacuum source 1602 by a vacuum source line 1604.

Initially, truck 740 and slide 710 are adjacent first linear end LE1 of hanger 720. In this position, truck 740 activates, e.g., presses, first vacuum switch 770A. Accordingly, vacuum source 1602 is coupled to vacuum line 780A and vacuum channel 1302A in hanger 720. Aperture 1502A is aligned with and directly above vacuum coupler trench 920 of slide 710. Thus, vacuum source 1602 is coupled to aperture 1502A and thus to vacuum coupler trench 920 through vacuum source line 1604, vacuum switch 770A, vacuum line 780A, and vacuum channel 1302A. In this manner, vacuum is supplied to vacuum coupler trench 920.

Figure 17:
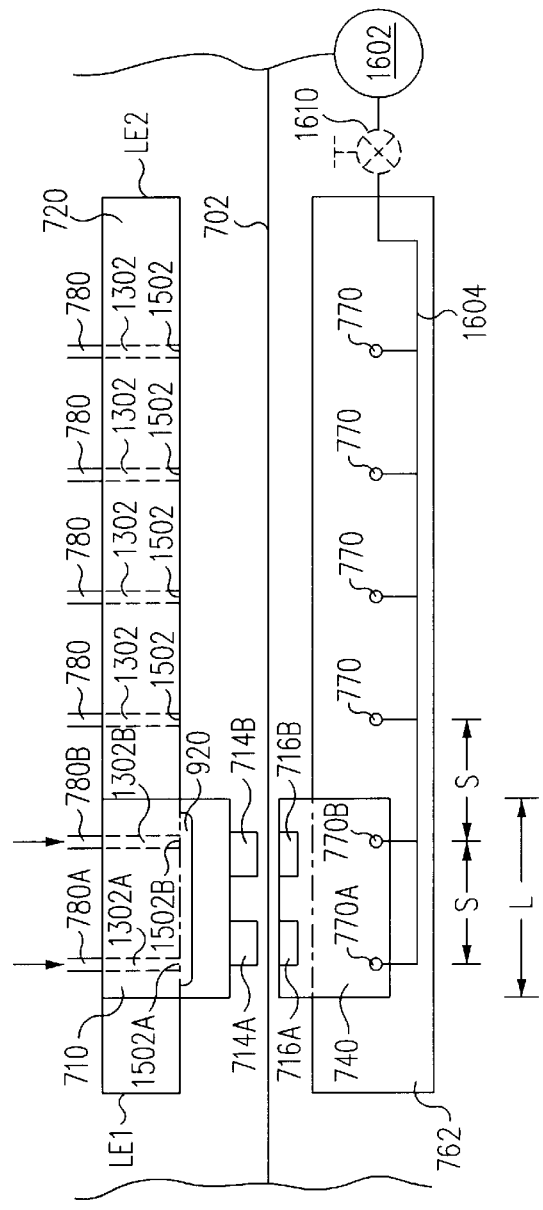

FIG. 17 is a side plan view of truck 740 and slide 710 during use in accordance with the present invention. As shown in FIG. 17, truck 740 and slide 710 are moved away from being directly adjacent linear end LE1 and towards linear end LE2 of hanger 720. This linear motion of truck 740 and slide 710 causes truck 740 to activate, e.g., press, a second vacuum switch 770B of the plurality a vacuum switches 770. Truck 740 has tapers 741 (illustrated in FIG. 8) to facilitate activation of vacuum switches 770. Accordingly, vacuum source 1602 is coupled to a second vacuum line 780B of the plurality of vacuum lines 780 and to a second vacuum channel 1302B of the plurality of vacuum channels 1302 in hanger 720.

A second aperture 1502B of the plurality of apertures 1502 is aligned with and directly above vacuum coupler channel 920 of slide 710. Thus, vacuum source 1602 is coupled to aperture 1502B and thus to vacuum coupler channel 920 through vacuum source line 1604, vacuum switch 770B, vacuum line 780B, and vacuum channel 1302B in hanger 720. Of importance, vacuum switch 770A is still also activated thus vacuum source 1602 is still also coupled to vacuum coupler trench 920 through vacuum channel 1302A as described above. Accordingly, vacuum is supplied to vacuum coupler trench 920 through both vacuum channels 1302A and 1302B.

Figure 18:
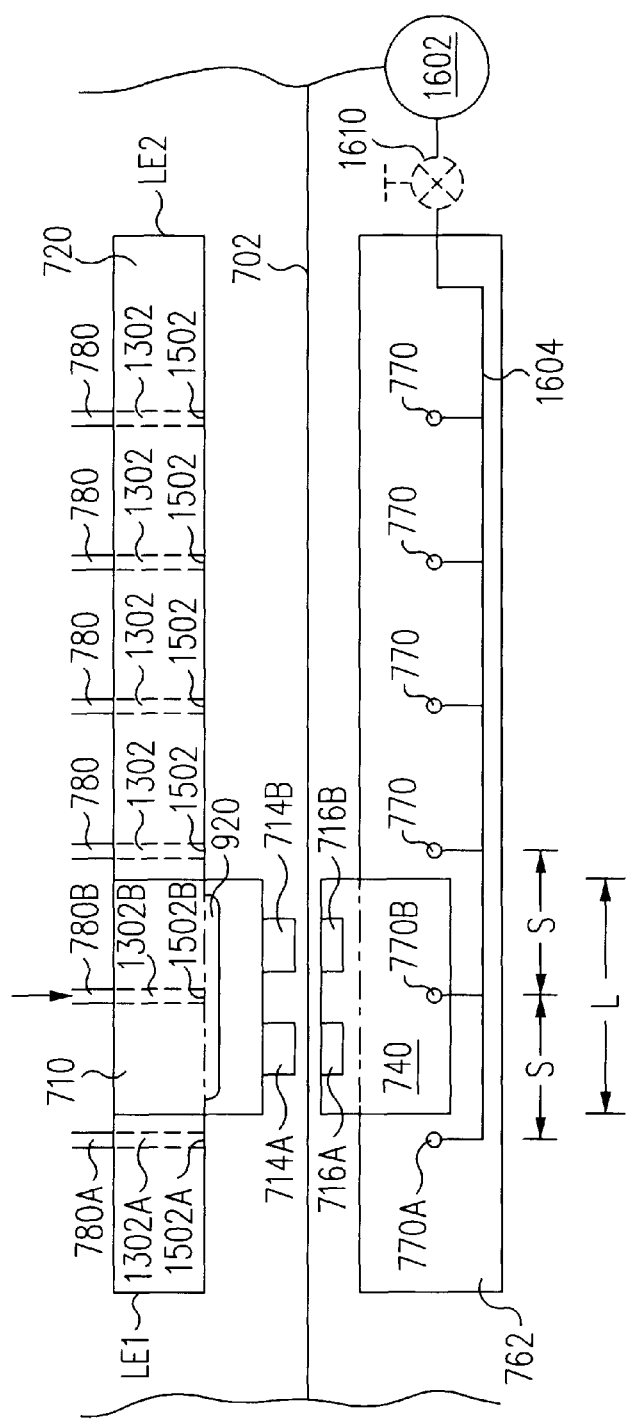

FIG. 18 is a side plan view of truck 740 and slide 710 during use in accordance with the present invention. As shown in FIG. 18, truck 740 and slide 710 are moved further away from linear end LE1 towards linear end LE2. This linear motion of truck 740 and slide 710 causes aperture 1502A to become unaligned with vacuum coupler channel 920. However, this linear motion of truck 740 and slide 710 also causes truck 740 to deactivate e.g., release, first vacuum switch 770A. Accordingly, vacuum source 1602 is decoupled from vacuum line 780A, vacuum channel 1302A and aperture 1502A in hanger 720.

However, vacuum switch 770B is still activated by truck 740 thus vacuum source 1602 is still coupled to vacuum coupler trench 920 through vacuum channel 1302B in hanger 720. Accordingly, vacuum is still supplied to vacuum coupler trench 920 through vacuum channel 1302B as described above. Accordingly, vacuum is continuously supplied to vacuum coupler trench 920.

Advantageously, vacuum switches 770 are selectively activated and deactivated in the above manner to continuously supply vacuum to vacuum coupler trench 920 as truck 740 and slide 710 move back and forth between linear end LE1 and linear end LE2 of hanger 720. More particularly, vacuum switches 770 are selectively activated only when the corresponding aperture 1502 is directly aligned with vacuum coupler trench 920. In this manner, vacuum is only supplied through a particular aperture 1502 when that particular aperture 1502 is directly aligned with vacuum coupler trench 920. Further, this prevents air (or other gas) from being unnecessarily drawn through apertures 1502 when they are not aligned with vacuum coupler trench 920.

In FIG. 17, vacuum switch 770A and vacuum switch 770B, i.e., two vacuum switches 770, are simultaneously activated. However, depending upon the length L of truck 740 and the spacing S between vacuum switches 770, e.g., between vacuum switch 770A and vacuum switch 770B, those of skill in the art will understand that more than two vacuum switches 770 can be simultaneously activated by truck 740. In one embodiment, when length L is greater than twice spacing S, a maximum of more than two vacuum switches 770 are simultaneously activated by truck 740 as truck 740 and slide 710 move between linear end LE1 and linear end LE2.

In FIG. 18, only vacuum switch 770B is activated, i.e., only a single vacuum switch 770 is activated. However, depending upon length L of truck 740 and spacing S between vacuum switches 770, those of skill in the art will understand that a minimum of two or more vacuum switches 770 can always be activated. Generally, at least one of vacuum switch 770 is always activated to continuously supply vacuum to vacuum coupler trench 920 as truck 740 and slide 710 move back and forth between linear end LE1 and linear end LE2 of hanger 720.

For simplicity, selective activation and deactivation of vacuum switches 770 to continuously supply vacuum from vacuum source 1602 to vacuum coupler trench 920 is described above. However, it is understood that pressurized gas is supplied from a pressurized gas source by selectively activating and deactivating pressurized gas switches 772 (FIGS. 7 and 8) to continuously supply pressurized gas to pressurized gas coupler trench 922 in a similar manner. More particularly, pressurized gas is continuously supplied to pressurized gas coupler trench 922 as described above with the exception being that vacuum source 1602, vacuum switches 770, vacuum lines 780, vacuum channels 1302, apertures 1502, and vacuum coupler trench 920 are a pressurized gas source 1602, pressurized gas switches 772, pressurized gas lines 782, pressurized gas channels 1304, apertures 1504, and pressurized gas coupler trench 922, respectively.

Further, it is understood that end effector vacuum is supplied by selectively activating and deactivating end effector vacuum switches 774 to supply end effector vacuum to end effector vacuum coupler trench 924. More particularly, end effector vacuum is supplied to end effector vacuum trench 924 as described above with the exception being that vacuum switches 770, vacuum lines 780, vacuum channels 1302, apertures 1502, and vacuum coupler trench 920 are end effector vacuum switches 774, end effector vacuum lines 784, end effector vacuum channels 1306, apertures 1506, and end effector vacuum coupler trench 924, respectively.

Further, to allow end effector vacuum from vacuum source 1602 to be selectively supplied to end effector vacuum switches 774, an end effector control valve 1610 (shown in dashed lines in FIGS. 16, 17 and 18) is coupled between vacuum source 1602 and end effector vacuum switches 774. As described above, vacuum is selectively supplied to end effector 414 (FIG. 4), which selectively grabs and releases substrates 418. End effector control valve 1610 opens and closes to couple and decouple, respectively, end effector vacuum from vacuum source 1602 to end effector vacuum switches 774 and thus to selectively supply vacuum to end effector 414.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

We claim:

1. A structure comprising:

a slide having a base comprising a first surface, a vacuum coupler trench and a pressurized gas coupler trench being in said first surface; and a hanger comprising a first vacuum channel and a first pressurized gas channel, said first vacuum channel extending to a first aperture aligned with said vacuum coupler trench, said first pressurized gas channel extending to a second aperture aligned with said pressurized gas coupler trench.

2. The structure of claim 1 wherein said slide has a linear axis, said vacuum coupler trench and said pressurized gas coupler trench being parallel in length to said linear axis.

3. The structure of claim 1 wherein said slide further comprises a first side member having a first surface, a first distributor being formed in said first surface of said first side member, said pressurized gas coupler trench being coupled to said first distributor.

4. The structure of claim 3 wherein said slide further comprises a second side member having a first surface, a second distributor being formed in said first surface of said second side member, said pressurized gas coupler trench being coupled to said second distributor.

5. The structure of claim 4 wherein said first surface of said base, said first surface of said first side member, and said first surface of said second side member collectively define an air bearing surface, a periphery of said air bearing surface being lined by a collector coupled to said vacuum coupler trench.

6. The structure of claim 1 wherein said slide comprises an air bearing surface comprising said first surface of said base, a periphery of said air bearing surface being lined with a collector coupled to said vacuum coupler trench.

7. The structure of claim 1 further comprising:
a vacuum switch coupled to said first vacuum channel; and
a vacuum source coupled to said vacuum switch.

8. The structure of claim 7 further comprising:
a pressurized gas switch coupled to said first pressurized gas channel; and
a pressurized gas source coupled to said pressurized gas switch.

9. The structure of claim 1 further comprising a truck magnetically coupled to said slide.

10. The structure of claim 9 further comprising a cover, said truck being magnetically coupled to said slide through said cover.

11. The structure of claim 9 wherein linear motion of said truck causes an equal linear motion of said slide.

12. The structure of claim 1 further comprising an end effector arm mounted to said slide.

13. The structure of claim 12 wherein said slide comprises an end effector extension portion protruding from said slide, said end effector arm being mounted to said end effector extension portion and thereby to said slide.

14. The structure of claim 12 wherein said end effector arm comprises an end effector.

15. The structure of claim 1 wherein an end effector vacuum coupler trench is in said first surface of said slide.

16. The structure of claim 15 further comprising an end effector arm mounted to said slide, said end effector arm comprising an end effector coupled to said end effector vacuum coupler trench.

17. The structure of claim 15 wherein said slide has a linear axis, said end effector vacuum coupler trench being parallel in length to said linear axis.

18. The structure of claim 15 wherein said hanger further comprises a first end effector vacuum channel extending to a third aperture aligned with said end effector vacuum coupler trench.

19. A structure comprising:
an air bearing surface;
a vacuum coupler trench in said air bearing surface, said vacuum coupler trench being parallel in length to a linear axis of said structure;
a collector lining a periphery of said air bearing surface, said collector being coupled to said vacuum coupling trenchx; and
an end effector vacuum coupler trench in said air bearing surface.

20. The structure of claim 19 further comprising a pressurized gas coupler trench in said air bearing surface.

21. The structure of claim 20 wherein said pressurized gas coupler trench is parallel in length to said linear axis of said structure.

22. The structure of claim 19 further comprising:
a base having a first surface;
a first side member having a first surface; and
a second side member having a first surface, wherein said air bearing surface is defined by said first surface of said base, said first surface of said first side member, and said first surface of said second side member.

23. The structure of claim 19 wherein said end effector vacuum coupler trench is parallel in length to said linear axis of said structure.

24. A structure comprising:
a slide comprising:
a base comprising a first surface;
a vacuum coupler trench in said first surface;
a pressurized gas coupler trench in said first surface; and
a hanger comprising:
vacuum channels extending to first apertures lying upon a first line, wherein a length of said vacuum coupler trench is aligned with said first line; and
pressurized gas channels extending to second apertures lying upon a second line, wherein a length of said pressurized gas coupler trench is aligned with said second line.

25. The structure of claim 24 wherein said hanger comprises a linear axis, said first line and said second line being parallel to said linear axis.

26. The structure of claim 24 wherein said slide further comprises an end effector vacuum coupler trench in said first surface and wherein said hanger further comprises end effector vacuum channels extending to third apertures lying upon a third line, wherein a length of said end effector vacuum coupler trench is aligned with said third line.

* * * * *